United States Patent
Yano et al.

(10) Patent No.: US 8,384,077 B2
(45) Date of Patent: Feb. 26, 2013

(54) FIELD EFFECT TRANSISTOR USING OXIDE SEMICONDUTOR AND METHOD FOR MANUFACTURING THE SAME

(75) Inventors: Koki Yano, Chiba (JP); Hirokazu Kawashima, Chiba (JP); Kazuyoshi Inoue, Chiba (JP); Shigekazu Tomai, Chiba (JP); Masashi Kasami, Chiba (JP)

(73) Assignee: Idemitsu Kosan Co., Ltd, Tokyo (JP)

( * ) Notice: Subject to any disclaimer, the term of this patent is extended or adjusted under 35 U.S.C. 154(b) by 243 days.

(21) Appl. No.: 12/747,573

(22) PCT Filed: Dec. 10, 2008

(86) PCT No.: PCT/JP2008/072387
§ 371 (c)(1),
(2), (4) Date: Jul. 15, 2010

(87) PCT Pub. No.: WO2009/075281
PCT Pub. Date: Jun. 18, 2009

(65) Prior Publication Data
US 2010/0289020 A1 Nov. 18, 2010

(30) Foreign Application Priority Data
Dec. 13, 2007 (JP) .................. 2007-321898

(51) Int. Cl.
*H01L 29/86* (2006.01)
*H01L 29/10* (2006.01)

(52) U.S. Cl. .................. 257/43; 257/57; 257/59

(58) Field of Classification Search .................. 257/43, 257/57, 59
See application file for complete search history.

(56) References Cited

U.S. PATENT DOCUMENTS

| | | | |
|---|---|---|---|
| 6,563,174 B2 | 5/2003 | Kawasaki et al. | |
| 7,411,209 B2* | 8/2008 | Endo et al. | 257/43 |
| 2003/0047785 A1 | 3/2003 | Kawasaki et al. | |
| 2005/0199880 A1* | 9/2005 | Hoffman et al. | 257/72 |
| 2005/0199959 A1 | 9/2005 | Chiang et al. | |
| 2006/0108636 A1 | 5/2006 | Sano et al. | |
| 2006/0110867 A1 | 5/2006 | Yabuta et al. | |

(Continued)

FOREIGN PATENT DOCUMENTS

| | | |
|---|---|---|
| JP | 2000-44236 A | 2/2000 |
| JP | 2003-86808 A | 3/2003 |

(Continued)

OTHER PUBLICATIONS

International Search Report of PCT/JP2008/072387 (Feb. 9, 2009).

(Continued)

*Primary Examiner* — Ori Nadav
(74) *Attorney, Agent, or Firm* — Millen, White, Zelano & Branigan, P.C.

(57) ABSTRACT

A field effect transistor which includes, on a substrate, at least a semiconductor layer, a passivation layer for the semiconductor layer, a source electrode, a drain electrode, a gate insulating film and a gate electrode, the source electrode and the drain electrode being connected through the semiconductor layer, the gate insulating film being present between the gate electrode and the semiconductor layer, the passivation layer being at least on one surface side of the semiconductor layer, and the semiconductor layer including a composite oxide which comprises In (indium), Zn (zinc) and Ga (gallium) in the following atomic ratios (1) to (3):

$$In/(In+Zn)=0.2 \text{ to } 0.8 \quad (1)$$
$$In/(In+Ga)=0.59 \text{ to } 0.99 \quad (2)$$
$$Zn/(Ga+Zn)=0.29 \text{ to } 0.99 \quad (3).$$

12 Claims, 6 Drawing Sheets

U.S. PATENT DOCUMENTS

| | | |
|---|---|---|
| 2007/0090365 A1 | 4/2007 | Hayashi et al. |
| 2007/0187760 A1 | 8/2007 | Furuta et al. |
| 2009/0189153 A1 | 7/2009 | Iwasaki et al. |

FOREIGN PATENT DOCUMENTS

| | | |
|---|---|---|
| JP | 2006-165529 A | 6/2006 |
| JP | 2006-165531 A | 6/2006 |
| JP | 2007-115902 A | 5/2007 |
| JP | 2007-142195 A | 6/2007 |
| JP | 2007-281409 A | 10/2007 |
| WO | WO 2007/089048 A2 | 8/2007 |

OTHER PUBLICATIONS

C. J. Kim et al. Highly Stable Ga2O3-In2O3-ZnO TFT for Active-Matrix Organic Light-Emitting Diode Display Application, 2006 International Electron Devices Meeting, vol. 1 of 2 (Dec. 11-13, 2006) pp. 41-44.

* cited by examiner

FIELD EFFECT TRANSISTOR USING OXIDE SEMICONDUTOR AND METHOD FOR MANUFACTURING THE SAME

TECHNICAL FIELD

The invention relates to a field effect transistor using an oxide semiconductor film as a channel layer and a method for producing the same.

BACKGROUND ART

A field effect transistor such as a thin film transistor (TFT) is widely used as a unit electronic element of a semiconductor memory integrated circuit, a high-frequency signal amplification element, a liquid crystal driving element or the like. It is an electronic device which is most practically used recently.

Of these, with a remarkable development of displays in recent years, a TFT is widely used as a switching element which serves to drive a display by applying a driving voltage to a display device in various displays such as liquid crystal displays (LCD), electroluminescence displays (EL) and field emission displays (FED).

As the material for a semiconductor layer (channel layer) which is the primary element of a field effect transistor, silicon semiconductor compounds are most widely used. In general, a silicon single crystal is used in a high-frequency amplification element, an integrated circuit element or the like which require high-speed operation. On the other hand, in a liquid crystal driving element or the like, an amorphous silicon semiconductor (amorphous silicon) is used in order to meet the demand for an increase in area.

As examples of a TFT, an inverted-staggered TFT can be given in which a gate electrode, a gate-insulating layer, a semiconductor layer such as hydrogenated amorphous silicon (a-Si:H), source and drain electrodes are stacked on a substrate such as glass. This TFT are used, in a field of large-area devices including an image sensor, as a driving element for flat panel displays represented by active matrix-type liquid crystal displays. In these applications, with an improvement in function, an increase in operation speed is demanded even for conventional TFTs using amorphous silicon.

Today, as a switching element for driving a display, a device using a silicon-based semiconductor film constitutes the mainstream due to various excellent performances including improved stability and process ability of a silicon thin film and a high switching speed. Such a silicon-based thin film is generally produced by the chemical vapor deposition (CVD) method.

Meanwhile, a crystalline silicon-based thin film is required to be heated at a high temperature, for example, 800° C. or higher, for crystallization. Therefore, it is difficult to form a crystalline silicon-based thin film on a glass substrate or on a substrate formed of an organic substance. Accordingly, a crystalline silicon-based thin film can be formed only on an expensive substrate having a high thermal resistance such as silicon wafer and quartz. In addition, it has a problem that a large amount of energy and a large number of steps are required in production.

Further, since the application of a crystalline silicon-based thin film is normally restricted to a TFT with a top-gate configuration, a reduction in production cost such as a decrease in number of masks is difficult.

On the other hand, an amorphous silicon thin film, which can be formed at a relatively low temperature, has a lower switching speed as compared with a crystalline silicon semiconductor. Therefore, when used as a switching element for driving a display, a high-speed animation may not be displayed.

Further, when a semiconductor active layer is irradiated with visible rays, it exhibits conductivity, and current leakage occurs to cause malfunction, resulting in a deteriorated performance as a switching element. Therefore, a method is known to provide a light-shielding layer to shield visible rays. As the light-shielding layer, a thin metal film is known.

However, if a light-shielding layer formed of a thin metal film is provided, not only the production steps are increased but also a problem arises that, due to a floating potential, the light-shielding layer is required to be fixed to ground level, which results in generation of parasitic capacitance.

Specifically, in the case of a liquid crystal display television having a resolution of VGA, amorphous silicon having a mobility of 0.5 to 1 $cm^2$/Vs could be used. For a liquid crystal display television having a resolution of SXGA, UXGA, QXGA or higher, a mobility of 2 $cm^2$/Vs or higher is required. A further higher mobility is required if the driving frequency is increased in order to improve the image quality.

If amorphous silicon, of which the properties change by a DC stress, is used in an organic EL display which is driven by current, a problem occurred that image quality deteriorated if used for a long period of time.

In addition, if crystalline silicon is used in these applications, a demand for an increase in area could not be satisfied or the production cost increased since a high-temperature heat treatment was required.

Under such circumstances, in recent years, as a film which is more improved in stability than a silicon-based semiconductor thin film, an oxide semiconductor thin film using an oxide has attracted attention.

For example, Patent Document 1 discloses a TFT using zinc oxide as the semiconductor layer.

However, this semiconductor layer has a field effect mobility of as low as about 1 $cm^2$/Vs·sec and a small on-off ratio. In addition, since current leakage tends to occur easily, practical application thereof on the industrial scale was difficult. Further, many studies have been made on an oxide semiconductor obtained by using zinc oxide which contains crystalline substances. If this oxide semiconductor is formed into a film by a sputtering method which is generally conducted on the industrial scale, the following problems occurred.

That is, a TFT may have deteriorated performance such as a low mobility, a small on-off ratio, a large amount of current leakage, unclear pinch-off and tendency of becoming normally-on. In addition, since this oxide semiconductor has poor chemicals resistance, the production process or the use environment had restrictions such as difficulty in wet etching. Further, in order to improve the performance, film formation was required to be conducted at a higher pressure, which caused industrial application to be difficult due to a lower film-forming speed and a higher treatment temperature exceeding 700° C. Further, TFT performance such as field mobility in a bottom-gate configuration was poor. In order to improve the performance, the film thickness was required to be 50 nm or more in a top-gate configuration, which restricted the TFT device structure.

In order to solve these problems, a TFT using an amorphous semiconductor film formed of indium oxide and zinc oxide has been studied (see Patent Document 2).

This oxide semiconductor film had a problem that a sufficient on-off ratio could not be obtained easily due to a high off current when used in a transistor.

As described in Patent Document 3, studies have been made on the application of a composite oxide containing indium elements, zinc elements and gallium elements, which oxide was conventionally studied as a transparent conductive film, to a TFT (see Non-Patent Document 1).

However, in a TFT using a semiconductor film composed of this composite oxide, in order to keep the S value small or to decrease a shift in threshold value by a stress, it was required to apply a substantial thermal history (for example, a heat treatment at a high temperature of 350° C. or higher for 1 hour or more or the like). The TFT is easily affected by surrounding environments such as light and air.

Patent Document 1: JP-A-2003-86808
Patent Document 2: U.S. 2005/0199959
Patent Document 3: JP-A-2000-44236
Non-Patent Document 1: Kim, Chang Jung et al. Highly Stable Ga2O3-In2O3-ZnO TFT for Active-Matrix Organic Light-Emitting Diode Display Application, Electron Devices Meetings, 2006. IEDM '06. International (ISBN: 1-4244-0439-8)

The invention has been made in view of the above-mentioned circumstances, and an object thereof is to provide a field effect transistor having a high mobility and a small S value.

Another object of the invention is to provide the method for producing a field effect transistor which can attain improved properties by application of a thermal history at a low temperature or for a short period of time.

DISCLOSURE OF THE INVENTION

According to the invention, the following field effect transistor is provided.

1. A field effect transistor which comprises, on a substrate, at least a semiconductor layer, a passivation layer for the semiconductor layer, a source electrode, a drain electrode, a gate insulating film and a gate electrode, the source electrode and the drain electrode being connected through the semiconductor layer, the gate insulating film being present between the gate electrode and the semiconductor layer, the passivation layer being at least on one surface side of the semiconductor layer, and the semiconductor layer comprising a composite oxide which comprises In (indium), Zn (zinc) and Ga (gallium) in the following atomic ratios (1) to (3):

$$In/(In+Zn)=0.2 \text{ to } 0.8 \quad (1)$$

$$In/(In+Ga)=0.59 \text{ to } 0.99 \quad (2)$$

$$Zn/(Ga+Zn)=0.29 \text{ to } 0.99 \quad (3)$$

2. The field effect transistor according to 1, wherein the composite oxide further satisfies the following atomic ratio (4):

$$Ga/(In+Zn+Ga)=0.01 \text{ to } 0.2 \quad (4)$$

3. The field effect transistor according to 1 or 2, wherein the semiconductor layer is an amorphous film which has an energy width ($E_0$) on the non-localized level of 14 meV or less.

4. The field effect transistor according to any one of 1 to 3, wherein the semiconductor layer is an amorphous film which keeps at least part of the edge-sharing structure of a bixbyite structure of indium oxide.

5. The field effect transistor according to any one of 1 to 4, which has a field effect mobility of 1 cm$^2$/Vs or more, an on off ratio of 10$^6$ or more, an off current of 1 pA or less, an S value of 0.8 V/dec or less, a threshold voltage of 0 V or more and 10 V or less, and an amount of shift in threshold voltage before and after application of a 10 μA-direct voltage at 50° C. for 100 hours of 1.5 V or less.

6. The field effect transistor according to any one of 1 to 5, which has a structure for shielding the semiconductor layer from light.

7. The field effect transistor according to any one of 1 to 6, wherein the passivation layer for the semiconductor layer comprises an amorphous oxide or an amorphous nitride.

8. The field effect transistor according to any one of 1 to 7, wherein at least one of the source electrode, the drain electrode and the gate electrode comprises an alloy containing copper.

9. The field effect transistor according to any one of 1 to 8, which further comprises a contact layer between the semiconductor layer and at least one of the source electrode, the drain electrode and the gate electrode.

10. The field effect transistor according to any one of 1 to 9, which further comprises an oxide resistant layer having a resistance higher than that of the semiconductor layer between the semiconductor layer and the gate insulating film and/or between the semiconductor layer and the passivation layer.

11. The field effect transistor according to any one of 1 to 10, wherein the semiconductor layer further comprises one or more elements selected from the group consisting of Sn (tin), Ge (germanium), Si (silicon), Ti (titanium), Zr (zirconium) and Hf (hafnium) in an amount of 100 to 10000 atomic ppm.

12. A method for producing the field effect transistor according to any one of 1 to 11, comprising the steps of forming a semiconductor layer by DC or AC sputtering by using a sintered target of a composite oxide and conducting a heat treatment at 70 to 350° C. after the formation of the semiconductor layer and a passivation layer for the semiconductor layer.

13. A liquid crystal display or an organic electroluminescence display using the field effect transistor according to any one of 1 to 11.

14. A sintered target for an oxide semiconductor comprising a composite oxide which comprises in (indium), Zn (zinc) and Ga (gallium) in the following atomic ratios (1) to (3):

$$In/(In+Zn)=0.2 \text{ to } 0.8 \quad (1)$$

$$In/(In+Ga)=0.59 \text{ to } 0.99 \quad (2)$$

$$Zn/(Ga+Zn)=0.29 \text{ to } 0.99 \quad (3)$$

15. The sintered target for an oxide semiconductor which comprises the composite oxide according to 14, which further comprises one or more elements selected from the group consisting of Sn (tin), Ge (germanium), Si (silicon), Ti (titanium), Zr (zirconium) and Hf (hafnium) in an amount of 100 to 10000 atomic ppm.

According to the invention, it is possible to obtain a field effect transistor having a high mobility and a small S value. Further, according to the invention, a field effect transistor can be produced by application of a thermal history at a low temperature or a short period of time.

BRIEF DESCRIPTION OF THE DRAWINGS

FIG. 9 is a schematic cross-sectional view of a field effect transistor prepared in Comparative Example 2 or the like;

BEST MODE FOR CARRYING OUT THE INVENTION

The field effect transistor of the invention has, on a substrate, at least a semiconductor layer, a passivation layer of the semiconductor layer, a source electrode, a drain electrode, a gate insulating film and a gate electrode.

Figure 1:
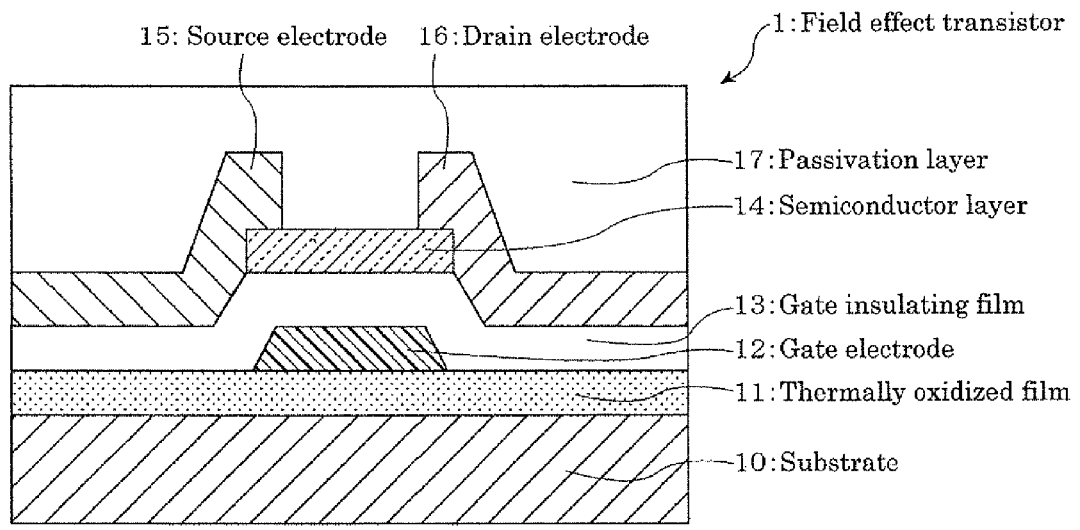
FIG. 1 is a schematic cross-sectional view of a field effect transistor according to one embodiment of the invention.

FIG. 1 is a schematic cross-sectional view of a field effect transistor according to one embodiment of the invention.

In the field effect transistor 1, a gate electrode 12 is formed in a striped pattern on a silicon substrate 10 having a thermally oxidized film 11. A gate insulating film 13 is formed so as to cover the gate electrode 12, and a semiconductor layer 14 (active layer) is formed on this gate insulating film 13 above the gate electrode 12.

To one end 14a of the semiconductor layer 14, a source electrode 15 is connected in a direction orthogonally crossing the gate electrode 12. To the other end 14b of the semiconductor layer 14, which is opposing to the one end 14a, a drain electrode 16 is connected.

A passivation layer 17 is formed so as to cover the semiconductor layer 14, the source electrode 15 and the drain electrode 16.

Figure 2:
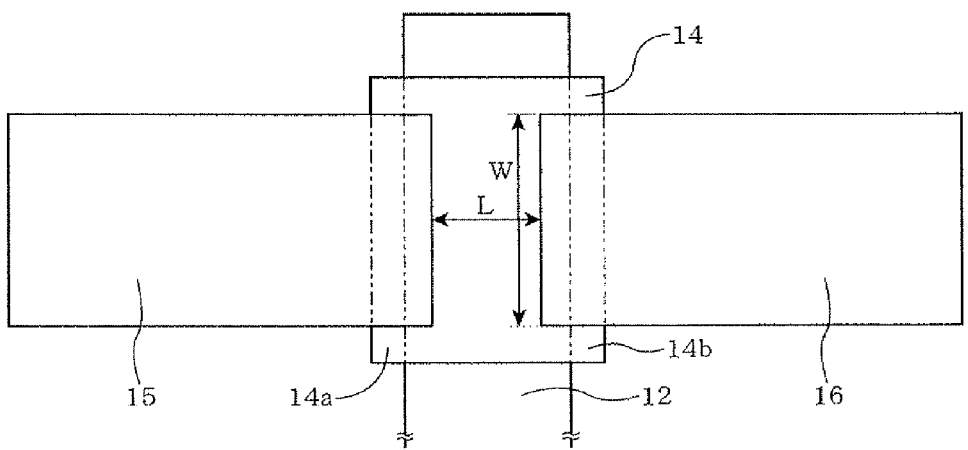
FIG. 2 is a schematic top view of a field effect transistor 1.

FIG. 2 is a schematic top view showing the positional relationship of the gate electrode 12, the semiconductor layer 14, the source electrode 15 and the drain electrode 16. In order to allow the positional relationship to be visible, part of constituting elements are not shown.

The field effect transistor of the invention is characterized in that it has a passivation layer for the semiconductor layer. If the semiconductor layer has no passivation layer, oxygen in the surface layer of the semiconductor layer may be withdrawn in vacuum or at a lower pressure, resulting in a higher off current and a negative threshold voltage. Without the passivation layer, even in the air, transistor properties such as threshold voltage may vary largely due to the influence caused by the surrounding environment such as moisture.

The characteristic feature of the invention resides in that the semiconductor layer is formed of a composite oxide containing an In (indium) element, Zn (zinc) element and Ga (gallium) element in the following ratios (atomic ratio) (1) to (3):

$$In/(In+Zn)=0.2 \text{ to } 0.8 \quad (1)$$

$$In/(In+Ga)=0.59 \text{ to } 0.99 \quad (2)$$

$$Zn/(Ga+Zn)=0.29 \text{ to } 0.99 \quad (3)$$

By allowing the semiconductor layer to be formed of the above-mentioned composite oxide, a field effect transistor having a high mobility and a low S value can be obtained. In addition, a field effect transistor which can exhibit excellent properties can be obtained, even if the transistor has only thermal history at a low temperature or for a short period of time.

In the above-mentioned formula (1), if the ratio of In is smaller than 0.2, the mobility may be lowered, the S value may be increased, the moisture proof may be lowered and resistance to chemicals such as an acid, an alkali or the like may be lowered. If the ratio of In is larger than 0.8, the off current or the gate leakage current may become large, the S value may be large and the threshold value may become negative to cause the transistor to be normally-on.

The In/(In+Zn) is preferably 0.3 to 0.75, more preferably 0.35 to 0.7.

In the above-mentioned formula (2), if the ratio of In is smaller than 0.59, the mobility may be lowered, the S value may be increased and the threshold voltage may be increased. If the ratio of In is larger than 0.99, the off current or the gate leakage current may become large, the threshold value may become negative to allow the transistor to be normally-on and a shift in threshold voltage may be increased.

The In/(In+Ga) is preferably 0.6 to 0.98, more preferably 0.65 to 0.98, with 0.7 to 0.97 being particularly preferable.

In the above-mentioned formula (3), if the ratio of Zn is smaller than 0.29, the mobility may be lowered, the S value may be increased, a high-temperature or a long-time heat treatment may be required for stabilization and the wet etching rate may be slow. If the ratio is larger than 0.99, the mobility may be lowered, the S value may be increased, the stability or resistance to heat may be lowered, the moisture proof may be lowered, the resistance to chemicals such as an acid and an alkali may be lowered and a shift in threshold voltage may be increased.

The Zn/(Ga+Zn) is preferably 0.45 to 0.98, more preferably 0.6 to 0.98, with 0.7 to 0.97 being particularly preferable.

in the invention, it is preferred that the semiconductor layer further satisfy the ratio (atomic ratio) shown by the following formula (4):

$$Ga/(In+Zn+Ga)=0.01 \text{ to } 0.2 \quad (4)$$

In the above-mentioned formula (4), if the ratio of Ga is larger than 0.2, the S value may be increased, the mobility may be lowered or the threshold voltage may be increased. If the ratio of Ga is smaller than 0.01, the stability or resistance to heat may be lowered, the moisture proof may be lowered, resistance to chemicals such as an acid and an alkali may be lowered and a shift in threshold voltage may be increased.

In order to decrease the S value and to improve the on-off ratio, the Ga/(In+Zn+Ga) is more preferably 0.01 to 0.05, further preferably 0.02 to 0.05.

In order to suppress a shift in threshold voltage and to improve the on-off ratio, the Ga/(In+Zn+Ga) is more preferably 0.05 to 0.2, further preferably 0.05 to 0.12 and particularly preferably 0.05 to 0.1.

In order to realize a proper use according to need, it is particularly preferable if the semiconductor layer satisfies the ratio (atomic ratio) shown by the following formula (5) or the following formula (6):

$$In/(In+Zn+Ga)=0.3 \text{ to } 0.5 \quad (5)$$

$$In/(In+Zn+Ga)=0.5 \text{ to } 0.7 \text{ (0.5 is not included)} \quad (6)$$

With the above-mentioned ratio (5), the off current may be decreased easily and the on-off ratio can be increased. In addition, film forming conditions or post treatment conditions can be set more freely. With the above-mentioned ratio (6), it is possible to increase the mobility and to decrease the threshold voltage.

The configuration of the field effect transistor of the invention is not limited to that of the field effect transistor 1 shown in FIG. 1. For example, the configurations shown by in the following FIGS. 3 to 7 can be given.

Figure 3:
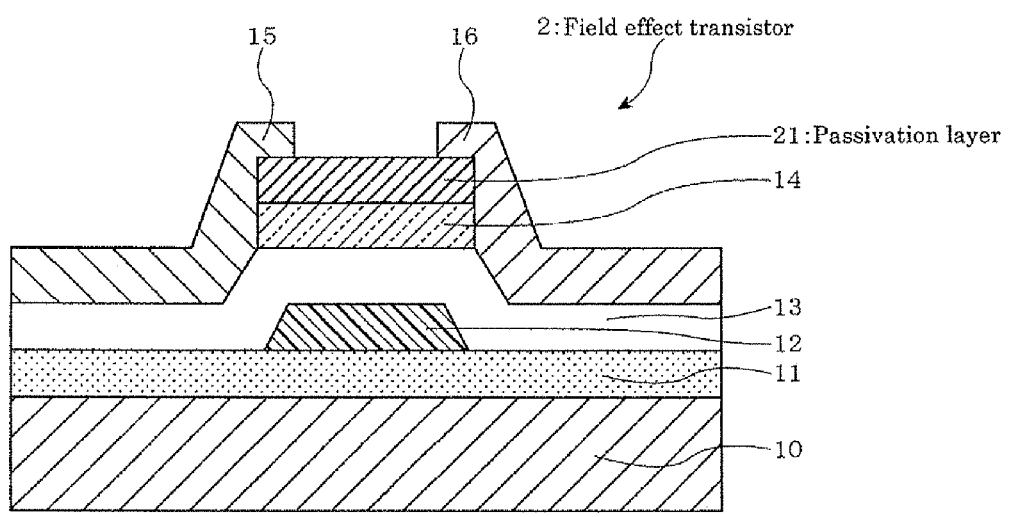
FIG. 3 is a schematic cross-sectional view of a field effect transistor according to another embodiment of the invention.

FIG. 3 is a schematic cross-sectional view of a field effect transistor according to another embodiment of the invention. The field effect transistor 2 has a configuration in which a passivation layer 21 is stacked on the semiconductor layer 14. Other configurations are similar to those of the above-mentioned field effect transistor 1.

Figure 4:
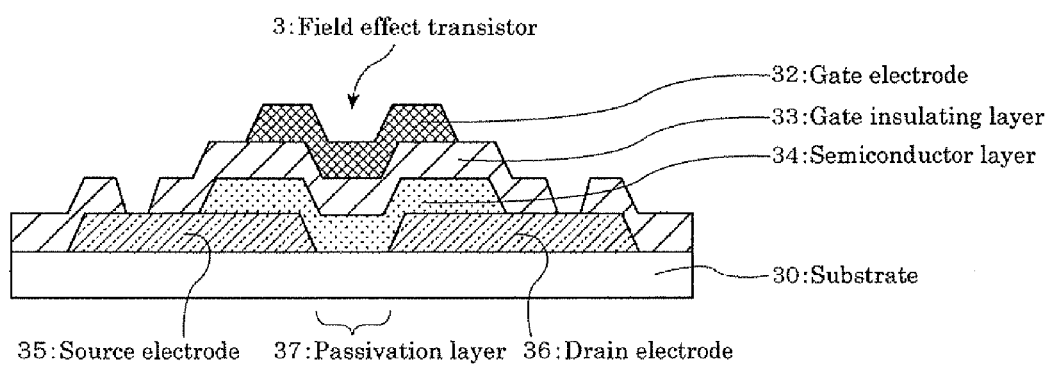
FIG. 4 is a schematic cross-sectional view of a field effect transistor according to another embodiment of the invention.

FIG. 4 is a schematic cross-sectional view showing a top-gate type field effect transistor.

In the field effect transistor 3, a source electrode 35 and a drain electrode 36 are formed on a substrate 30. A semiconductor layer 34 is provided so as to cover a gap between the electrodes and part of these electrodes. A gate electrode 32 is formed above the semiconductor layer 34 with the gate insulating film 33 there between.

In the transistor 3, the substrate 30 serves as a passivation layer 37.

It is preferred that the passivation layer be used in a bottom-gate type transistor as shown in FIG. 1 and FIG. 3. In a bottom-gate type transistor, a main part of the semiconductor layer is exposed without the passivation layer. Accordingly, the effects of providing the passivation layer are significant.

It is preferred that the field effect transistor of the invention have a structure capable of shielding the semiconductor layer from light (for example, a light-shielding layer).

Figure 5:
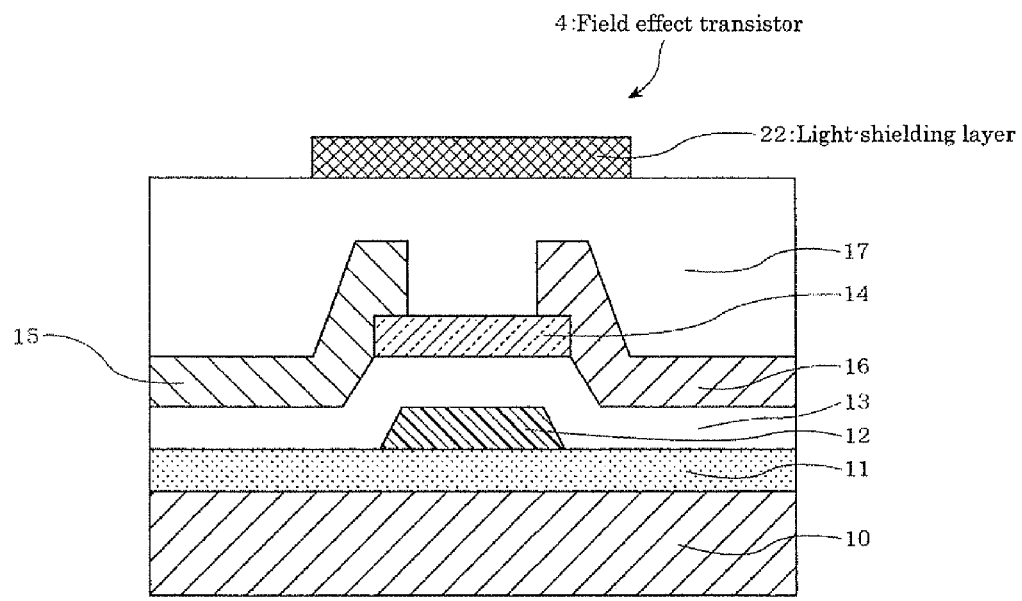
FIG. 5 is a schematic cross-sectional view of a field effect transistor according to another embodiment of the invention.

FIG. 5 is a schematic cross-sectional view of a field effect transistor according to another embodiment of the invention. In a field effect transistor 4, in order to shield the semiconductor layer 14 from light, a light-shielding layer 22 is provided on the passivation layer 17. Other configurations are similar to those in the above-mentioned field effect transistor 1. On the side of the substrate 10, the gate electrode 12 serves as the light-shielding layer.

Without the light-shielding structure, when the semiconductor layer 14 is exposed to light, carrier electrons may be excited, thereby to increase the off current.

The light-shielding layer may be provided above or under the semiconductor layer. It is preferred that the light-shielding layers be provided on both above and under the semiconductor layer. The light-shielding layer may be used as the gate insulting film, the black matrix or the like. If the light-shielding layer is provided only on one side, it is necessary to contrive the structure to prevent light from irradiating from the side on which no light-shielding layer is provided.

In the field effect transistor of the invention, it is preferred that a contact layer be provided between the semiconductor layer and at least one of the source electrode, the drain electrode and the gate electrode.

Figure 6:
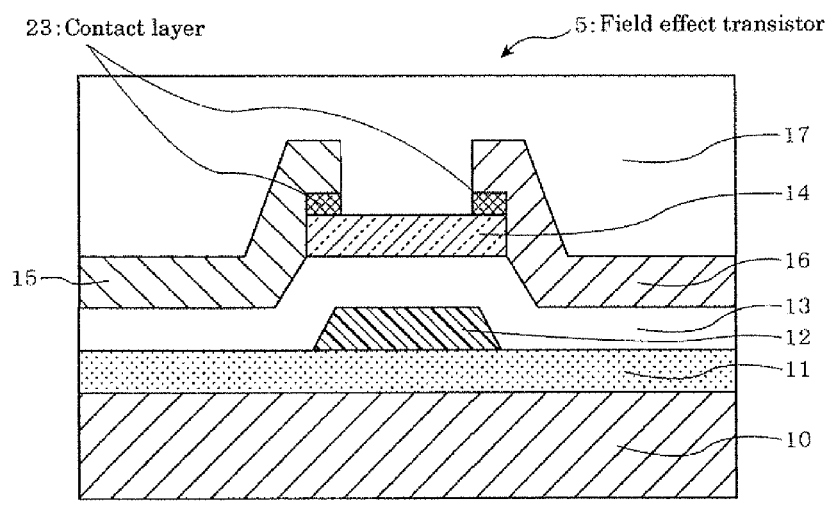
FIG. 6 is a schematic cross-sectional view of a field effect transistor according to another embodiment of the invention.

FIG. 6 is a schematic cross-sectional view showing a field effect transistor according to another embodiment of the invention. In a field effect transistor 5, contact layers 23 are provided between the semiconductor layer 14 and the source electrode 15 and between the semiconductor layer 14 and the drain electrode 16, respectively. Other configurations are similar to those in the above-mentioned field effect transistor 1.

The contact layer may be formed by allowing the end part of the semiconductor layer 14 to be denatured.

Figure 7:
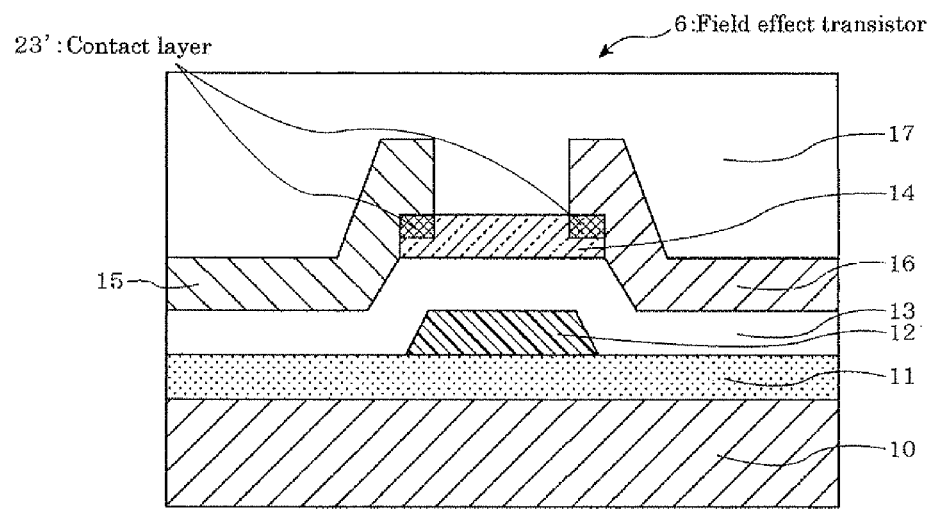
FIG. 7 is a schematic cross-sectional view of a field effect transistor according to another embodiment of the invention.

FIG. 7 is a schematic cross-sectional view of the field effect transistor according to another embodiment of the invention.

In this transistor, contact layers 23' are formed by denaturing the end parts 14*a* and 14*b* of the semiconductor layer.

Each constituting element of the field effect transistor will be explained below.
1. Substrate There are no particular restrictions, and known substrates in the art can be used. For example, glass substrates such as alkali silicate glass, non-alkali glass and quartz glass, silicon substrates, resin substrates such as acryl, polycarbonate and polyethylene naphthalate (PEN) and high-molecular film bases such as polyethylene terephthalate (PET) and polyamides.

The thickness of the substrate or the base is normally 0.1 to 10 mm, preferably 0.3 to 5 mm. In the case of a glass substrate, it is preferable to use a glass substrate which is chemically or thermally reinforced.

If transparency or smoothness is required, a glass substrate and a resin substrate are preferable, with a glass substrate being particularly preferable. If a substrate is required to be light in weight, it is preferable to use a resin substrate or a high-molecular base.
2. Semiconductor Layer As mentioned above, the semiconductor layer is formed of a composite oxide which contains an In (indium) element, a Zn (zinc) element and a Ga (gallium) element such that they satisfy the above-mentioned ratios (1) to (3), preferably the ratios (1) to (4).

These semiconductor layers can be prepared by forming a thin film by using a target satisfying the above-mentioned ratios (1) to (3) or the ratios (1) to (4).

The target is formed of powder mixture containing indium oxide, zinc oxide and gallium oxide in such an amount that satisfies the above-mentioned element ratio, for example. The target can be prepared by pulverizing the raw material powder by means of a ball mill or the like, molded into a target-like form, followed by firing.

The raw material powder used may be one which is prepared from a scrap containing high-purity indium oxide such as remaining target materials or used targets. In particular, raw material powder collected from an ITO target is preferable since it contains an appropriate amount of Sn (tin) as impurities. Collection of indium oxide can be conducted by a known method such as one disclosed in JP-A-2002-069544.

It is preferred that one or more elements selected from the group consisting of Sn (tin), Ge (germanium), Si (silicon), Ti (titanium), Zr (zirconium) and Hf (hafnium) be added to the raw material in an amount of 100 to 10000 atomic ppm.

The purity of each raw material powder is normally 99.9% (3N) or more, preferably 99.99% (4N) or more, further preferably 99.995% or more, and particularly preferably 99.999% (5N) or more. If the purity of each raw material powder is less than 99.9% (3N), problems caused by impurities may arise that the semiconductor properties may be lowered, reliability may be lowered or the like.

As for the raw material powder, it is preferred that the specific surface area of indium oxide powder be 8 to 10 $m^2/g$, the specific surface area of gallium oxide powder be 5 to 10 $m^2/g$ and the specific surface area of zinc oxide powder be 2 to 4 $m^2/g$. It is preferred that the median diameter of indium oxide powder be 1 to 2 μm, the median diameter of gallium oxide powder be 1 to 2 μm and the median diameter of zinc oxide powder be 0.8 to 1.6 μm.

It is preferable to use indium oxide powder and gallium oxide powder of which the specific surface areas be almost the same. In this way, pulverizing and mixing can be conducted more efficiently. Specifically, it is preferred that the difference in specific surface area be 5 $m^2/g$ or less. If the difference in specific surface area is too large, efficient pulverizing and mixing may not be conducted, and gallium oxide particles may remain in a sintered body.

The powder mixture is pulverized and mixed by means of a wet medium stirring mill. At this time, it is preferable to conduct pulverization such that the specific surface area after the pulverization be increased in an amount of 1.5 to 2.5 m²/g as compared with the specific surface area of the raw material powder, or such that the average median diameter after the pulverization become 0.6 to 1 μm. By using the raw material powder prepared in this way, it is possible to obtain a high-density oxide sintered body without the need of pre-firing process. A reduction process will also be unnecessary.

If an increase in specific surface area of the raw material powder mixture is less than 1.0 m²/g or the average median diameter of the raw material powder mixture after pulverization exceeds 1 μm, the sintering density may not be sufficiently large. On the other hand, if an increase in specific surface area of the raw material powder mixture exceeds 3.0 m²/g or if the average median diameter after the pulverization is less than 0.6 μm, the amount of contaminants (the amount of impurities which have been mixed in) from a pulverizer or the like during the pulverization may be increased.

Here, the specific surface area of each powder is a value measured by the BET method. The median diameter of each powder is a value measured by a particle size distribution analyzer. These values can be adjusted by pulverizing powder by a dry pulverization method, a wet pulverization method or the like.

The raw material after the pulverization is molded after drying by means of a spray dryer or the like. For the molding, a known molding method such as pressure molding and cold isostatic molding can be used.

Subsequently, the resulting molded product is sintered to obtain a sintered body. It is preferred that sintering be conducted at 1200 to 1600° C. for 2 to 20 hours. The temperature is more preferably 1250 to 1400° C. If the sintering temperature is less than 1200° C., the density may not be increased. A sintering temperature exceeding 1600° C. may result in problems that zinc evaporates to cause the composition of the sintered body to vary, the average crystal particle size of the target becomes too large or voids are generated in the sintered body by evaporation.

As for the sintering, it is preferable to conduct sintering in an oxygen atmosphere by circulating oxygen or conduct sintering under pressure. In this way, evaporation of zinc can be suppressed, whereby a sintered body having no voids can be obtained.

The sintered body produced by the above-mentioned method has a high density, and hence, it can produce an oxide semiconductor film improved in film properties since it generates a less amount of nodules or particles during use.

An oxide sintered body becomes a target by subjecting it to a processing such as polishing. Specifically, for example, a sintered body is ground by means of a surface grinder to allow it to have a surface roughness Ra of 5 μm or less. Further, the sputtering surface of the target is subjected to mirror polishing to allow an average surface roughness Ra to be 1000 Å or less. This mirror polishing can be conducted by a known polishing technology such as mechanical polishing, chemical polishing and mechanochemical polishing (combination of mechanical polishing and chemical polishing). For example, polishing may be conducted to a roughness of #2000 or more by using a fixed abrasive polisher (polishing solution: water), or, polishing may be conducted by lapping by means of a free abrasive lap (abrasive: SiC paste or the like) and then lapping by using diamond paste instead of the abrasive. There are no particular restrictions on such polishing method.

By bonding to a backing plate, the resulting sputtering target can be installed in various film-forming apparatuses. As examples of the film-forming method, the sputtering method, the PLD (pulse laser deposition) method, the vacuum vapor deposition method, the ion plating method or the like can be given.

For cleaning the target, air blowing, washing with running water or the like can be used. If removal of foreign matters is performed by air blowing, foreign matters can be effectively removed by absorbing the air by means of a dust collector facing the nozzle.

In addition to air blowing or washing with running water, it is possible to conduct ultrasonic cleaning or the like. In the ultrasonic cleaning, it is effective to conduct the ultrasonic cleaning by generating multiple oscillation within a frequency of 25 to 300 KHz. For example, ultrasonic cleaning may be performed by generating multiple oscillation of 12 kinds of frequencies of from 25 to 300 KHz every 25 KHz.

When the target is used as a sputtering target, the bulk resistance of the target is preferably less than 20 mΩcm, more preferably less than 10 mΩcm, further preferably less than 5 mΩcm, and particularly preferably less than 2 mΩcm. If the bulk resistance is 20 mΩcm or more, when DC sputtering is conducted for a long time, spark may be generated due to abnormal discharge to cause the target to be cracked or the properties of the resulting film as an oxide semiconductor film may be deteriorated due to the adhesion of particles which have jumped out from the target by the spark to a formed film on a substrate. In addition, the target may be cracked during discharge.

The bulk resistance is a value measured by the four probe method using a resistivity meter.

The particle size of each compound in the oxide sintered body is preferably 20 μm or less, further preferably 10 μm or less. The particle size is an average particle size measured by an electron probe micro-analyzer (EPMA). The preferable crystal particle size is obtained by adjusting, for example, the amount ratio of each powder of indium oxide, gallium oxide and zinc oxide as raw materials or the particle size, the purity, the heating time, the sintering temperature, the sintering time, the sintering atmosphere and the cooling time of the raw material powder.

In the invention, it is preferred that the semiconductor layer be an amorphous film.

If the semiconductor layer is an amorphous film, adhesiveness to an insulating film and a protective film may be improved or uniform transistor properties can be easily obtained even if the area is large.

Whether the semiconductor film is amorphous or not can be confirmed by an X-ray crystal structure analysis. If a clear peak is not observed, the film is amorphous.

In order to form an amorphous film, it is preferred that the substrate temperature during film formation be 350° C. or less, the total pressure be 2 Pa or less and the oxygen content be 5% or less. It is more preferred that the partial pressure of water or hydrogen be $10^{-6}$ Pa or more.

It is preferred that the semiconductor layer be an amorphous film and that the energy width ($E_0$) on the non-localized level of the semiconductor layer be 14 meV or less. If the energy width ($E_0$) on the non-localized level of the semiconductor layer exceeds 14 meV, the mobility may be lowered or the threshold value and the S value may be too large. A large energy width ($E_0$) on the non-localized level of the semiconductor layer appears to be caused by a poor short range order of the amorphous film.

The energy width ($E_0$) on the non-localized level of the semiconductor layer is more preferably 10 meV or less, further preferably 8 meV or less, and particularly preferably 6 meV or less.

The energy width ($E_0$) on the non-localized level of the amorphous oxide semiconductor film can be obtained from the relationship between the carrier concentration and the activation energy, measured by using the hall effect while changing the temperature in a range from 4 to 300K.

In order to allow the energy width ($E_0$) on the non-localized level to be 14 meV or less, it is preferred that the semiconductor layer be subjected to a heat treatment at 70 to 350° C. in an environment where an oxygen partial pressure of an inert gas such as nitrogen and argon is $10^{-3}$ Pa or less or after covering the semiconductor layer with a passivation layer.

The water partial pressure during film formation is preferably $10^{-3}$ Pa or less.

It is preferred that the semiconductor layer contain indium oxide and keep at least part of the edge-sharing structure of the bixbyite structure of indium oxide. With such a structure, the distance between indium atoms becomes short to cause the s-orbits of indium atoms to be more overlapped, whereby improvement in mobility can be expected.

Whether the amorphous film containing indium oxide keeps at least part of the edge-sharing structure of the bixbyite structure of indium oxide can be confirmed by the presence of a peak derived from In—X (X is In, Ga, Zn) between 0.30 to 0.36 nm by using a radial distribution function (RDF) obtained by grazing incidence X-ray scattering (GIXS) conducted by using high-luminance synchrotron radiation or the like. For details, reference can be made to the following documents.

F. Utsuno, et al., Thin Solid Films, Volume 496, 2006, Pages 95-98

In order to keep at least part of the edge-sharing structure of the bixbyite structure, it is preferred that the semiconductor layer be subjected to a heat treatment at 70 to 350° C. in an environment where an oxygen partial pressure of an inert gas such as nitrogen and argon is $10^{-1}$ Pa or less or after covering the semiconductor layer with a passivation layer. The water partial pressure during film formation is preferably $10^{-3}$ Pa or less.

As the inert gas, $N_2$, He, Ne, Ar, Kr and Xe are preferable.

In the semiconductor layer of the invention, if the maximum value of RDF with an interatomic distance of 0.30 to 0.36 nm is taken as A and the maximum value of RDF with an interatomic distance of 0.36 to 0.42 is taken as B, it is preferred that the relationship A/B>0.7 be satisfied. The A/B>0.85 is more preferable, and A/B>1 us still more preferable, with the A/B>1.2 being particularly preferable.

If the A/B is 0.7 or less, when the semiconductor layer is used as the active layer of a transistor, the mobility may be lowered, the threshold value or the S value may be too large. A small A/B appears to be caused by a poor short range order of the amorphous film.

It is preferred that the average In—In bonding distance be 0.3 to 0.322 nm, with 0.31 to 0.32 nm being particularly preferable. The average In—In bonding distance can be obtained by an X-ray absorption spectroscopy. In the measurement by an X-ray absorption spectroscopy, an extended X-ray absorption fine structure (EXAFS) extending to an energy higher by several hundreds eV from the rising edge is shown. The EXAFS is caused by backward scattering of electrons by atoms surrounding excited atoms. An interference of a wave of electrons which are jumped out and a wave of electrons which are scattered backwardly occurs. The interference depends on the wavelength in an electron state and the light path in which electrons move to surrounding atoms. A radial distribution function (RDF) can be obtained by Fourier transforming EXAFS. The average bonding distance can be estimated from the peak of RDF.

It is preferred that the semiconductor layer further contain one or more elements selected from the group consisting of Sn (tin), Ge (germanium), Si (silicon), Ti (titanium), Zr (zirconium) and Hf (hafnium) in an amount of 100 to 10000 ppm (atom), with 200 to 2000 ppm being particularly preferable. If these atoms are not contained, the semiconductor layer may not be formed uniformly, and an un-uniform semiconductor layer may result.

The thickness of the semiconductor layer is normally 0.5 to 500 nm, preferably 1 to 150 nm, more preferably 3 to 80 nm, and particularly preferably 10 to 60 nm. If the thickness is smaller than 0.5 nm, it is difficult to conduct film formation uniformly on the industrial scale. If the thickness is larger than 500 nm, the film forming time is prolonged, resulting in difficulty in industrial application. If the thickness is within a range of 3 to 80 nm, TFT properties such as mobility and on-off ratio are significantly excellent.

It is preferred that the semiconductor layer be an amorphous film having an electron carrier concentration of within a range of $10^{13}$ to $10^{18}/cm^3$ and have a band gap of 2.0 to 5.0 eV. More preferably, the band gap is 2.8 to 4.8 eV. If the band gap is smaller than 2.0 eV, the semiconductor layer absorbs visible light to cause a field effect transistor to malfunction. If the band gap is larger than 5.0 eV, a field effect transistor may not function.

It is preferred that the semiconductor layer be a non-degenerative semiconductor showing a thermal activation-type behavior. If the semiconductor layer is a degenerative semiconductor, the off current/gate leakage current may be increased due to an excessive number of carriers, and hence, the threshold value may be negative to allow the transistor to be normally-on.

The surface roughness (RMS) of the semiconductor layer is preferably 1 nm or less, further preferably 0.6 nm or less, and particularly preferably 0.3 nm or less. If the surface roughness is larger than 1 nm, the mobility may be lowered.

3. Passivation Layer for Semiconductor Layer

Although there are no particular restrictions on the material for forming the passivation layer for the semiconductor, it is preferred that the passivation layer be formed of an amorphous oxide or an amorphous nitride.

For example, $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN or the like may be used. Of these, $SiO_2$, SiNx, $Al_2O_3$, $Y_2O_3$, $Hf_2O_3$ and $CaHfO_3$ are preferably used, with $SiO_2$, SiNx, $Y_2O_3$, $Hf_2O_3$ and $CaHfO_3$ being more preferable. Oxides such as $SiO_2$, $Y_2O_3$, $Hf_2O_3$ and $CaHfO_3$ are particularly preferable. The oxide number of these oxides may not necessarily coincide with the stoichiometrical ratio (for example, they may be $SiO_2$ or SiOx). SiNx may contain a hydrogen element.

Such a passivation layer may be a stack structure in which two or more different insulating films are stacked.

The passivation layer may be crystalline, polycrystalline or amorphous. It is preferred that the layer be polycrystalline or amorphous since it can be produced easily on the industrial scale. In particular, it is preferred that the passivation layer be amorphous. If it is not an amorphous film, the smoothness of an interface may be poor, and hence, the mobility may be lowered, the threshold voltage or the S value may be too large.

If the passivation layer is not an oxide, oxygen in the semiconductor moves toward the passivation layer, and as a result, the off current may be increased or the threshold voltage may be negative to cause the transistor to be normally-on.

An organic insulating film such as poly(4-vinylphenol) (PVP) or parylene may be used in the passivation layer of the semiconductor layer. Further, the passivation layer of the semiconductor layer may have a stack structure in which an inorganic insulating film and an organic insulating film are stacked in two or more.

4. Gate Insulating Film

There are no particular restrictions on the material for forming the gate insulating film. Materials which are commonly used can be selected arbitrarily within a range which does not impair advantageous effects of the invention. For example, $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN or the like may be used. Of these, $SiO_2$, SiNx, $Al_2O_3$, $Y_2O_3$, $Hf_2O_3$ and $CaHfO_3$ are preferably used, with $SiO_2$, SiNx, $Y_2O_3$, $Hf_2O_3$ and $CaHfO_3$ being more preferable. Oxides such as $SiO_2$, $Y_2O_3$, $Hf_2O_3$ and $CaHfO_3$ are particularly preferable. The number of oxygen in these oxides may not necessarily coincide with the stoichiometrical ratio (for example, they may be $SiO_2$ or SiOx). SiNx may contain a hydrogen element.

The gate insulating film may be a stack structure in which two or more different insulating films are stacked. If two or more gate insulating films are stacked, it is preferred that the film which contacts the semiconductor layer be a film of an oxide such as $SiO_2$. The gate insulating film may be crystalline, polycrystalline or amorphous. It is preferred that the gate insulating film be polycrystalline or amorphous since it can be produced easily on the industrial scale. An amorphous film having a smooth interface is particularly preferable.

An organic insulating film such as poly(4-vinylphenol) (PVP) or parylene may be used in the gate insulating film. Further, the gate insulating film may have a stack structure in which an inorganic insulating film and an organic insulating film are stacked in two or more.

5. Electrode

There are no particular restrictions on the material for forming each of the gate electrode, the source electrode and the drain electrode. Materials which are commonly used can be arbitrary used within a range which does not impair the advantageous effects of the invention. For example, transparent electrodes such as indium tin oxide (ITO), indium zinc oxide, ZnO and $SnO_2$, metal electrodes such as Al, Ag, Cr, Ni, Mo, Au, Ti, Ta and Cu, or metal electrodes of alloys containing these metals can be used. In addition, it is preferable to stack two or more of these layers to decrease contact resistance or to increase interfacial strength.

In the invention, it is preferred that at least one of the source electrode, the drain electrode and the gate electrode be formed of an alloy containing copper. Since an alloy containing copper has a low resistance, a large-screen, high-precision display can be realized if it is combined with a semiconductor layer having a high mobility. Examples of an alloy containing copper include Cu—Mg, Cu—Mn or the like. Of these alloys, a copper-manganese alloy (Cu—Mn) is preferable since not only it has a low resistance but also it is free from peeling or surface oxidation.

If the electrode does not contain copper, the resistance of a wiring is increased, which makes the electrodes to be unsuitable for use in a large-area, high-precision display. If the electrode is formed only of copper, a problem of contact resistance may occur due to peeling or surface oxidation.

6. Light Shielding Layer

As the light-shielding layer, it is preferable to use a material having a large absorption or reflection in a wavelength region of 500 nm or less.

For example, thin films of metals or alloys such as Cr, Ni—Mo and Ni—Mo—Fe and a resin black obtained by dispersing carbon or Ti in a photoresist can be used.

7. Contact Layer

The composite oxide having a composition similar to that of the above-mentioned semiconductor layer may be used in forming a contact layer. That is, it is preferred that the contact layer contain each of In, Zn and Ga elements. If the contact layer does not contain these elements, elements may move between the contact layer and the semiconductor layer, and a shift in threshold voltage may be increased when a stress test or the like is conducted.

There are no particular restrictions on the method for forming the contact layer. It is possible to form a contact layer having the same composition ratio as that of the semiconductor layer by changing film forming conditions, to form a layer having a composition ratio different from that of the semiconductor layer, to form a contact layer by subjecting a part of the semiconductor layer which contacts the electrode to a plasma treatment or an ozone treatment to increase the resistance thereof, or to form a layer having a higher resistance by adjusting film forming conditions such as an oxygen partial pressure when forming a semiconductor layer.

In the field effect transistor of the invention, it is preferred that an oxide resistant layer having a higher resistance than that of the semiconductor layer be formed between the semiconductor layer and the gate insulating film and/or between the semiconductor layer and the passivation layer. Without the oxide resistant layer, an off current may be generated and the threshold voltage may be negative to cause the transistor to be normally-on. In addition, the semiconductor layer may be denatured to have deteriorated properties during post treatment processes such as the formation of a protective film or etching.

The following can be exemplified as the oxide resistant layer:

An amorphous oxide film having the same composition as that of the semiconductor layer which is formed at an oxygen partial pressure which is higher than that during the formation of a semiconductor film An amorphous oxide film obtained by adding, to an oxide containing each of In, Zn and Ga, one or more elements selected from Cu, Co, Ni, Mn, Fe, Mg, Ca, Sr, Ba, Ag and Au A polycrystalline oxide film comprising indium as a main component A polycrystalline oxide film comprising indium oxide as a main component which is doped with one or more positive divalent elements such as Zn, Cu, Co, Ni, Mn and Mg In the case of an amorphous oxide film which is obtained by adding to, an oxide containing each of In, Zn and Ga, one or more elements selected from Cu, Co, Ni, Mn, Fe, Mg, Ca, Sr, Ba, Ag and Au, it is preferred that the composition ratio of In be smaller than that of the semiconductor layer. Further, it is preferred that the composition ratio of Ga be larger than that of the semiconductor layer.

It is preferred that the oxide resistant layer be an oxide which contains each of In, Zn and Ga. If the oxide resistant layer does not contain In, Zn and Ga, move of elements may occur between the oxide resistant layer and the semiconductor layer, and a shift in threshold voltage may be increased when a stress test or the like is conducted.

Next, an explanation is made on the method for producing a field effect transistor of the invention.

The production method of the invention is characterized in that it comprises the steps of forming a semiconductor layer by DC or AC sputtering by using a sintered target of a composite oxide and conducting a heat treatment at 70 to 350° C. after the formation of the semiconductor layer and a passivation layer for the semiconductor layer.

Each of the constituting elements (layer) of the above-mentioned field effect transistor can be formed by a technique which is known in the art.

Specifically, as the film forming method, chemical film forming methods such as the spray method, the dipping method and the CVD method, or physical film forming methods such as the vacuum vapor deposition method, the ion plating method and the pulse laser deposition method can be used. In respect of easiness in controlling the carrier density and easiness in improving film quality, it is preferable to use a physical film forming method. More preferably, the sputtering method is used due to its high productivity.

In the sputtering, it is possible to use a method in which a sintered target of a composite oxide is used, a method in which co-sputtering is conducted by using a plurality of sintered targets and a method in which reactive sputtering is conducted by using an alloy target. In the method where co-sputtering is conducted by using a plurality of sintered targets or in the method where reactive sputtering is conducted by using an alloy target, problems such as deterioration of uniformity or reproducibility and an increased energy width ($E_0$) on the non-localized level may occur, and as a result, deterioration of transistor properties such as a decrease in mobility or an increase in threshold voltage may occur. Preferably, a sintered target formed of a composite oxide is used.

The film formed can be patterned by various etching methods.

In the invention, the semiconductor layer is formed by DC or AC sputtering by using a sintered target of a composite oxide. By using DC sputtering or AC sputtering, damage during film forming may be suppressed as compared with the case of RF sputtering. Therefore, when used in the field effect transistor, effects such as a reduced shift in threshold voltage, an improved mobility, a decreased threshold voltage and a decreased S value can be expected.

In the invention, after forming the semiconductor layer and the passivation layer for the semiconductor layer, a heat treatment is conducted at 70 to 350° C. If a heat treatment is conducted at a temperature lower than 70° C., the resulting transistor may have a lowered resistance or stability to heat, a decreased mobility, an increased S value or an increased threshold value. On the other hand, if a heat treatment is conducted at a temperature higher than 350° C., a substrate having no thermal resistance may not be used, an extra cost for heat treatment equipment may be incurred, the interface of the passivation layer, the insulating film or the semiconductor layer may be deteriorated, or an amorphous film may not be obtained since crystallization may occur when a film is formed at a lowered water partial pressure.

The heat treatment temperature is preferably 80 to 260° C., more preferably 90 to 180° C. and particularly preferably 100 to 150° C. A heat treatment temperature of 180° C. or lower is preferable, since a resin substrate having a lower resistance to heat such as PEN or an inexpensive glass substrate (soda lime glass or low alkaline glass) can be used.

Although a heat treatment is conducted preferably normally for 1 second to 24 hours, it is preferable to adjust the heat treatment time according to the treatment temperature.

For example, at a heat treatment temperature of 70 to 180° C., the heat treatment time is preferably 10 minutes to 24 hours, more preferably 20 minutes to 6 hours, and particularly preferably 30 minutes to 3 hours. At a heat treatment temperature of 180 to 260° C., the heat treatment time is more preferably 6 minutes to 4 hours, further preferably 15 minutes to 2 hours. At a heat treatment temperature of 260 to 300° C., the heat treatment time is more preferably 30 seconds to 4 hours, and particularly preferably 1 minute to 2 hours. At a heat treatment temperature of 300 to 350° C., the heat treatment time is more preferably 1 second to 1 hour, particularly preferably 2 seconds to 30 minutes.

It is preferred that the heat treatment be conducted in an environment where an oxygen partial pressure is $10^{-3}$ Pa or less in an inert gas or be conducted after the semiconductor layer is covered by the passivation layer. In the above-mentioned conditions, reproducibility is improved.

The water partial pressure at the time of formation of the semiconductor layer is preferably $10^{-3}$ Pa or less, more preferably $10^{-4}$ Pa or less and further preferably $10^{-5}$ Pa or less. If the water partial pressure is larger than $10^{-3}$ Pa, the energy width ($E_0$) on the non-localized level may be increased, the In—In average bonding distance may be increased, and carriers may be scattered significantly. Further, when used in a transistor, the mobility may be lowered or the threshold voltage may be too large. The reason therefore is assumed to be the generation of a hydroxyl group in indium oxide, although the confirmation thereof is difficult.

The mobility of the field effect transistor of the invention preferably is 1 $cm^2/Vs$ or more, more preferably 3 $cm^2/Vs$ or more and particularly preferably 8 $cm^2/Vs$ or more. If the mobility is smaller than 1 $cm^2/Vs$, the switching speed may be too slow to be used in a large-area, high-precision display.

The on-off ratio is preferably $10^6$ or more, more preferably $10^7$ or more and particularly preferably $10^8$ or more.

The off current is preferably 2 pA or less, more preferably 1 pA or less. If the off current is larger than 2 pA, the gate leakage current is preferably 1 pA or less.

The threshold voltage is preferably 0 to 10 V, more preferably 0 to 4 V, further preferably 0 to 3 V, and particularly preferably 0 to 2 V. If the threshold voltage is smaller than 0 V, the transistor may become normally-on, and as result, it may be required to apply a voltage when the transistor is in the off state, resulting in an increased consumption power. If the threshold voltage is larger than 10 V, the driving voltage may be increased, and as a result, the consumption power may be increased or a high mobility may be required.

The S value is preferably 0.8 V/dec or less, more preferably 0.3 V/dec or less, further preferably 0.25 V/dec or less and particularly preferably 0.2 V/dec or less. If the S value is larger than 0.8 V/dec, the driving voltage may be increased, resulting in an increase in consumption power. In particular, when used in an organic EL display which is driven by DC current, it is preferable to suppress the S value to 0.3 V/dec or less since the consumption power can be significantly decreased.

The S value (Swing Factor) is a value indicating the sharpness of the rising of the drain current from the off-state to the on-state when the gate voltage is increased from the off-state. Specifically, the S value is defined by the following formula. As shown by the following formula, the S value is an increase in gate voltage when the drain current is increase by one digit (10 times).

$$S \text{ value} = dVg/d \log(Ids)$$

A smaller S value means a sharp rising ("Thin Film Transistor Technology", by Ukai Yasuhiro, 2007, published by Kogyo Chosakai Publishing, Inc.)

When the S value is large, a high gate voltage is required to be applied when switching from the on-state to the off-state, which may result in an increased consumption power.

An amount of shift in threshold voltage before and after the application of a 10 μA-DC voltage at 50° C. for 100 hours is preferably 1.5 V or less, more preferably 1.0 V or less and particularly preferably 0.5 V or less. When the shift amount exceeds 1.5 V, if a transistor is used in an organic EL display, the image quality thereof may be changed.

Further, it is preferred that hysteresis when a gate voltage is increased or decreased in a transmission curve or a variation in threshold voltage when measurement is conducted in the air (variation of surrounding atmosphere) be small.

Figure 8:
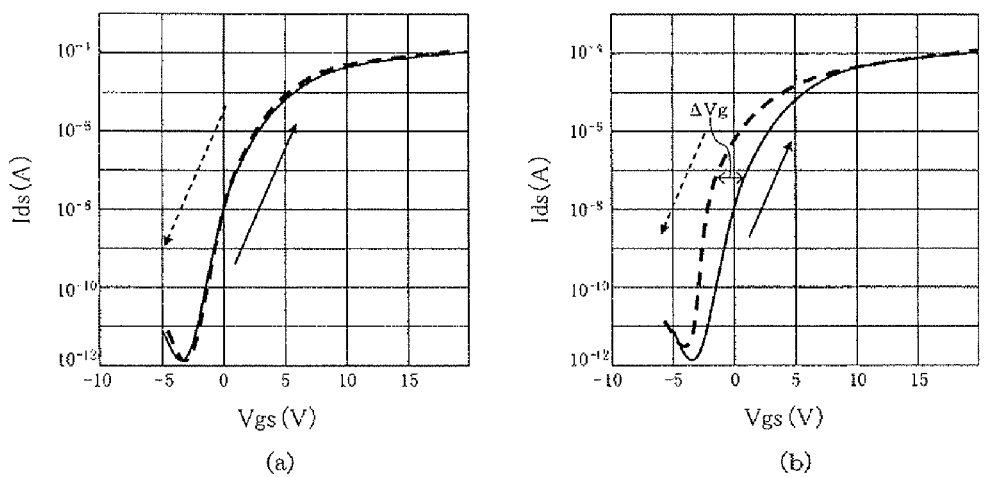
FIG. 8 is a view showing an example of a transmission curve, in which (a) is an example of slight hysteresis, and (b) is an example of substantial hysteresis.

An example of the transmission curve is shown in FIG. 8. FIG. 8(a) shows an example of slight hysteresis and FIG. 8(b) shows an example of substantial hysteresis.

The ratio (W/L) of the channel width W and the channel length L (see FIG. 2) is normally 0.1 to 100, preferably 0.5 to 20 and particularly preferably 1 to 8. If the W/L exceeds 100, the current leakage may be increased or the on-off ratio may be decreased. If the W/L is smaller than 0.1, the field effect mobility may be lowered or the pinch off may be unclear.

Further, the channel length L is normally 0.1 to 1000 μm, preferably 1 to 100 μm, more preferably 2 to 10 μm. If the channel length is less than 0.1 μm, it is difficult to produce the transistor on the industrial scale, and the current leakage may be increased. A channel length exceeding 1000 μm is not preferable since it makes the device too large in size.

The field effect transistor of the invention can be applied to an integrated circuit such as a logical circuit, a memory circuit, a differential amplification circuit. In particular, the field effect transistor can be used as a switching element for driving a liquid crystal display or an organic EL display.

In the liquid crystal display or the organic EL display of the invention, the field effect transistor of the invention as mentioned above is used in a driving element. As for other configurations, known configurations in the field of a liquid crystal display or an organic EL display can be appropriately used.

EXAMPLES

Example 1

A. Preparation of Target I

As the raw material, 5N (purity: 99.999%) indium oxide (INO04PB, manufactured by Kojundo Chemical Laboratory Co., Ltd.), 5N zinc oxide (ZNO04PB, manufactured by Kojundo Chemical Laboratory Co., Ltd.) and 5N gallium oxide (GAO03PB, manufactured by Kojundo Chemical Laboratory Co., Ltd.) were mixed such that the atomic ratio [In/(In+Zn+Ga)] became 0.42, the atomic ratio [Zn/(In+Zn+Ga)] became 0.42 and the atomic ratio [Ga/(In+Zn+Ga)] became 0.16. The mixture was supplied to a wet type ball mill and pulverized and mixed for 72 hours to obtain raw material fine powder.

The resulting raw material fine powder was granulated, and press-molded into a size of 10 cm in diameter and 5 mm in thickness. The molded product was put in a firing furnace, and fired at 1500° C. for 12 hours, whereby a sintered body (target) was obtained.

The target was pulverized and analyzed by inductively coupled plasma emission spectrometry (ICP), the content of impurities such as Sn (tin), Ge (germanium), Si (silicon), Ti (titanium), Zr (zirconium) and Hf (hafnium) was found to be less than 100 ppm. The bulk resistance of the target was 30 mΩ and the theoretical relative density was 0.95.

B. Preparation of a Specimen for Evaluating the Semiconductor Layer (1) Formation of the Semiconductor Layer The sputtering target I obtained in A above was installed in a film forming apparatus of the DC magnetron sputtering method, which is one of the DC sputtering methods, whereby a transparent conductive film (semiconductor layer) was formed on a glass substrate (Corning 1737).

The sputtering conditions were as follows:
Substrate temperature; 25° C., Ultimate pressure; $1\times10^{-6}$ Pa, Atmospheric gas; Ar 99% and oxygen 1.0%, Sputtering pressure (total pressure); $2\times10^{-1}$ Pa, Input power; 100 W, Film forming time; 8 minutes, S-T distance; 100 mm.

Prior to the film formation, the chamber was sufficiently baked, the ultimate pressure was sufficiently decreased, and the substrate was installed by means of a loadlock, whereby the water partial pressure during the film formation was lowered. The $H_2O$ (water) in the sputtering chamber was analyzed by a quadruple mass spectrometer (Q-mass) to measure the water partial pressure during the film formation. The water partial pressure during the film formation was found to be $1\times10^{-6}$ Pa or less.

As a result, a 70 nm-thick oxide thin film was formed on the glass substrate.

The composition of the resulting film was analyzed by the ICP method, and it was found that the atomic ratio [In/(In+Zn+Ga)] was 0.42, the atomic ratio [Zn/(In+Zn+Ga)] was 0.42 and the atomic ratio [Ga/(In+Zn+Ga)] was 0.16.

(2) Heat Treatment of the Semiconductor Layer

In a nitrogen environment, the semiconductor layer was subjected to a heat treatment at 150° C. for 2 hours, (3) Evaluation of Thin Film Properties The carrier concentration and the hall mobility of the semiconductor layer obtained in (2) above were measured by means of a hail measurement apparatus. As a result, it was found that the film was of n-type, had a carrier concentration of $8\times10^{16}$ $cm^{-3}$ and had a hall mobility of 1 $cm^2/Vs$.

The hall measurement apparatus and the measurement conditions thereof were as follows.
[Hall Measurement Apparatus]
Resi Test 8310, manufactured by Toyo Technica Co., Ltd.
[Measurement Conditions]
Measurement temperature: Room temperature (about 25° C.)
Magnetic field for measurement: 0.5 T
Current for measurement: $10^{-12}$ to $10^{-4}$ A
Measurement mode: AC magnetic field hall measurement
From the fact that no clear peak was observed in an X-ray crystal structure analysis, the film was confirmed to be amorphous. The surface roughness (RMS) measured by means of an atomic force microscope was 0.2 nm. The band gap obtained optically was 3.9 eV.

Further, the hall effect was measured by changing the measurement temperature in a range of 77 to 300K. As a result, it was found that film was a non-degenerate semiconductor showing a thermal activation-type behavior. From the relationship between the activation energy and the carrier concentration measured by using hall effect while changing the temperature, the energy width ($E_0$) on the non-localized level was found to be 6 meV or less.

Further, by a radial distribution function (RDF) obtained by an X-ray scattering measurement, a peak showing In—In was observed at around 0.35 nm, and it was confirmed that the edge-sharing structure of the bixbyite structure of indium oxide remained. The A/B when the maximum RDF value with an interatomic distance of 0.30 to 0.36 nm was taken as A and the maximum value of RDF with an interatomic distance of 0.36 to 0.42 was taken as B was found to be 1.5. The average In—In bonding distance obtained by the X-ray absorption spectroscopy was 0.317 nm.

C. Preparation of a Field Effect Transistor

A transistor similar to that shown in FIG. 1 except that a glass substrate was used as the substrate was prepared.

On a glass substrate, metal molybdenum was formed in a thickness of 200 nm by RF sputtering at room temperature, followed by patterning by wet etching to prepare a gate electrode.

Subsequently, on the substrate on which the gate electrode was prepared, SiNx was formed into a film (thickness: 200 nm) at 300° C. by a plasma-enhanced chemical vapor deposition (PECVD) apparatus to form a gate insulating film.

Then, using Target I, a thin film was formed under the conditions B(1) as mentioned above, followed by patterning to form a semiconductor layer.

Subsequently, by using a lift-off process and RF magnetron sputtering (room temperature, Ar 100%), source/drain electrodes formed of $In_2O_3$—ZnO were formed.

An $SiO_2$ passivation layer (passivation film) was formed thereon, followed by a heat treatment at 150° C. for 2 hours in an nitrogen environment, whereby a field effect transistor was produced (a bottom-gate type field effect transistor shown in FIG. 2, in which W was 20 μm and L was 5 μm).

For this field effect transistor, the following evaluation was conducted.

(1) Field effect mobility (μ), on-off ratio, off current, gate leakage current, S value, and threshold voltage (Vth)

Using a semiconductor parameter analyzer (Keithley 4200), measurement was conducted at room temperature, in vacuum ($10^{-3}$ Pa) and in the light-shielded environment.

Similarly, the Vth in the air was evaluated by using a semiconductor parameter analyzer.

(2) Hysteresis

Using a semiconductor parameter analyzer, a transmission curve at the time of increasing the voltage (I-V characteristics) and a transmission curve at the time of decreasing the voltage (I-V characteristics) were obtained, and a difference in voltage between when the voltage was increased and when the voltage was decreased was taken as ΔVg (see FIG. 8(b)). A transistor having a maximum ΔVg value of 0.5 V or less was evaluated as "slight", a transistor having a maximum ΔVg value of 0.5 to 3 V was evaluated as "substantial" and a transistor having a maximum ΔVg value of 3 V or more was evaluated as "significant".

(3) Stress Test

As the stress conditions, a 10 μA-DC voltage was applied at a gate voltage of 15 V at 50° C. for 100 hours. The Vth value before and after the application of a stress was compared to measure an amount of shift in threshold voltage (ΔVth).

The measurement results are shown in Table 1.

Examples 2 to 13 and Comparative Examples 1 to 11

Sputtering targets were prepared in the same manner as in Example 1, except that the mixing ratio of indium oxide, zinc oxide and gallium oxide as materials was adjusted to those shown in Tables 1 to 4.

Using the above-obtained targets, evaluation of the semiconductor layer and preparation and evaluation of a field effect transistor were conducted in the same manner as in Example 1, except that the film forming conditions were changed to those shown in Tables 1 to 4.

In Example 5, a Cu—Mn alloy was used in the gate electrode instead of metal molybdenum. In addition, an oxide resistant layer was formed between the semiconductor layer and the gate insulating film. Further, a contact layer was formed by subjecting a part of the semiconductor layer which contacts the source electrode and the drain electrode to a plasma treatment. The conditions for forming the contact layer and the oxide resistant layer were as follows.

Formation of an Oxide Resistant Layer

Using a target having an atomic ratio [In/(In +Zn+Ga)] of 0.34, an atomic ratio [Zn/(In +Zn+Ga)] of 0.34 and an atomic ratio [Ga/(In +Zn+Ga)] of 0.32, a film was formed in a thickness of 20 nm in the same film forming conditions except that the atmospheric gas was changed to one having a composition of Ar: 97% and $O_2$: 3%, whereby an oxide resistant layer was formed.

Formation of a Contact Layer

Treatment method: Hydrogen plasma, 20 W, 30 seconds

Almost similar effects were obtained when a contact layer was formed by using a UV irradiation (mercury lamp, 20 minutes).

Figure 9:
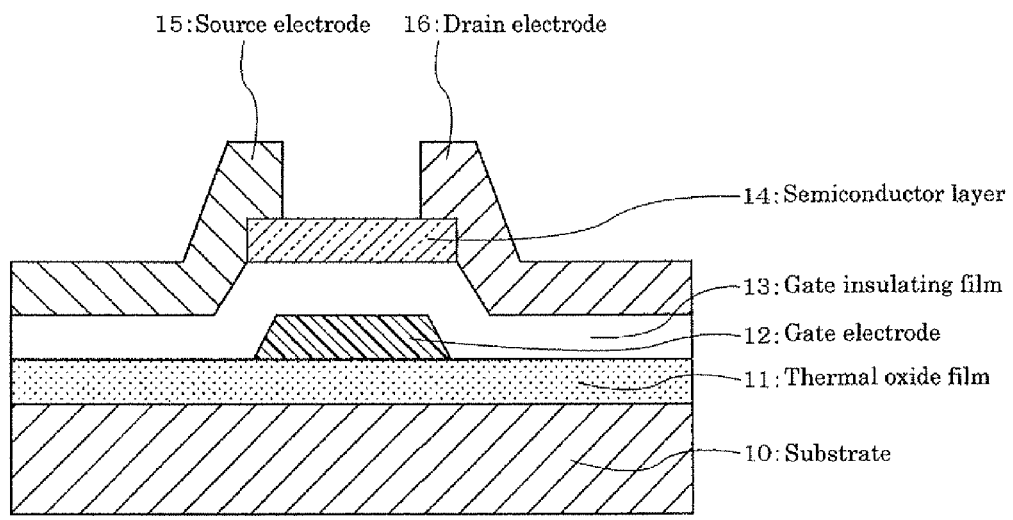

No passivation layer was formed in Comparative Examples 2, 3, 5, 6 and 8 to 11. This field effect transistor is shown in FIG. 9.

In Example 12 and Comparative Examples, the semiconductor layer was formed by RF sputtering.

Specifically, a target was installed in a RF magnetron sputtering film forming apparatus (manufactured by Shinko Seiki Co., Ltd.), and film formation was conducted. The sputtering conditions were as follows. Substrate temperature; 25° C., Ultimate pressure; $5 \times 10^{-6}$ Pa, Atmospheric gas; Ar 99.5% and oxygen 0.5%, Sputtering pressure (total pressure); $2 \times 10^{-1}$ Pa, Input power; 100 W, Film forming time; 8 minutes, and S-T distance; 100 mm.

Prior to the film formation, the chamber was sufficiently baked, the ultimate pressure was sufficiently decreased, and the substrate was installed by means of a loadlock, whereby the water partial pressure during the film formation was lowered. The $H_2O$ (water) in the sputtering chamber was analyzed by a quadruple mass spectrometer (Q-mass) to measure the water partial pressure during film formation. The water partial pressure during the film formation was found to be $1 \times 10^{-6}$ Pa or less.

TABLE 1

| | | Examples | | | | | | |
|---|---|---|---|---|---|---|---|---|
| | | 1 | 2 | 3 | 4 | 5 | 6 | 7 |
| Method and conditions for forming semiconductor layer | Sputtering method | DC | DC | DC | DC | DC | DC | DC |
| | Total pressure (Pa) | 0.2 | 0.2 | 0.2 | 0.2 | 0.2 | 0.2 | 0.2 |
| | Atmospheric gas | Ar: 99% $O_2$: 1% | Ar: 99% $O_2$: 1% | Ar: 99% $O_2$: 1% | Ar: 99% $O_2$: 1% | Ar: 99% $O_2$: 1% | Ar: 99% $O_2$: 1% | Ar: 99% $O_2$: 1% |

TABLE 1-continued

|  |  | Examples |  |  |  |  |  |  |
|---|---|---|---|---|---|---|---|---|
|  |  | 1 | 2 | 3 | 4 | 5 | 6 | 7 |
| Composition (atomic ratio) of target and semiconductor layer | In/(In + Zn + Ga) | 0.42 | 0.49 | 0.48 | 0.46 | 0.42 | 0.4 | 0.22 |
|  | Zn/(In + Zn + Ga) | 0.42 | 0.49 | 0.48 | 0.46 | 0.42 | 0.4 | 0.7 |
|  | Ga/(In + Zn + Ga) | 0.16 | 0.02 | 0.04 | 0.08 | 0.16 | 0.2 | 0.08 |
|  | In/(In + Zn) | 0.500 | 0.500 | 0.500 | 0.500 | 0.500 | 0.500 | 0.239 |
|  | In/(In + Ga) | 0.724 | 0.961 | 0.923 | 0.852 | 0.724 | 0.667 | 0.733 |
|  | Zn/(Ga + Zn) | 0.724 | 0.961 | 0.923 | 0.852 | 0.724 | 0.667 | 0.897 |
| State of semiconductor layer | XRD | Amorphous | Amorphous | Amorphous | Amorphous | Amorphous | Amorphous | Amorphous |
| Members used in transistor | Substrate | Glass | Glass | Glass | Glass | Glass | Glass | Glass |
|  | Gate insulating film | SiN$x$ | SiN$x$ | SiN$x$ | SiN$x$ | SiN$x$ | SiN$x$ | SiN$x$ |
|  | Passivation layer | $SiO_2$ | $SiO_2$ | $SiO_2$ | $SiO_2$ | $SiO_2$ | $SiO_2$ | $SiO_2$ |
| Heat treatment |  | Under $N_2$ 150° C. 2 Hr | Under $N_2$ 150° C. 2 Hr | Under $N_2$ 150° C. 2 Hr | Under $N_2$ 150° C. 2 Hr | Under $N_2$ 150° C. 2 Hr | Under $N_2$ 150° C. 2 Hr | Under $N_2$ 150° C. 2 Hr |
| Transistor properties | Mobility ($cm^2$/Vs) | 10 | 18 | 16 | 14 | 12 | 8 | 4 |
|  | On-off ratio | $10^9$ | $10^8$ | $10^9$ | $10^{10}$ | $10^9$ | $10^8$ | $10^8$ |
|  | Off current (pA) | 0.05 | 0.9 | 0.1 | 0.05 | 0.05 | 0.05 | 0.1 |
|  | Gate leakage current (pA) | 0.05 | 0.6 | 0.09 | 0.05 | 0.05 | 0.05 | 0.1 |
|  | S value (V/dec) | 0.2 | 0.08 | 0.1 | 0.12 | 0.09 | 0.28 | 0.35 |
|  | Vth (V) | 0.9 | 0.3 | 0.4 | 0.5 | 0.5 | 1.8 | 1.9 |
|  | Hysteresis | Slight | Slight | Slight | Slight | Slight | Slight | Slight |
|  | Vth variation in the air (V) | <±0.2 | <±0.2 | <±0.2 | <±0.2 | <±0.2 | <±0.2 | <±0.2 |
| Stress test | Threshold voltage shift Δ Vth (V) | 0.2 | 0.9 | 0.8 | 0.4 | 0.1 | 0.4 | 1.3 |

TABLE 2

|  |  | Examples |  |  |  |  |  |
|---|---|---|---|---|---|---|---|
|  |  | 8 | 9 | 10 | 11 | 12 | 13 |
| Method and conditions for forming semiconductor layer | Sputtering method | DC | DC | DC | DC | RF | DC |
|  | Total pressure (Pa) | 0.2 | 0.2 | 0.2 | 0.2 | 0.2 | 0.2 |
|  | Atmospheric gas | Ar: 99% $O_2$: 1% | Ar: 99% $O_2$: 1% | Ar: 99% $O_2$: 1% | Ar: 99% $O_2$: 1% | Ar: 99.5% $O_2$: 0.5% | Ar: 99% $O_2$: 1% |
| Composition (atomic ratio) of target and semiconductor layer | In/(In + Zn + Ga) | 0.32 | 0.6 | 0.7 | 0.46 | 0.48 | 0.49 |
|  | Zn/(In + Zn + Ga) | 0.6 | 0.32 | 0.22 | 0.2 | 0.48 | 0.49 |
|  | Ga/(In + Zn + Ga) | 0.08 | 0.08 | 0.08 | 0.32 | 0.04 | 0.02 |
|  | In/(In + Zn) | 0.348 | 0.652 | 0.761 | 0.697 | 0.500 | 0.500 |
|  | In/(In + Ga) | 0.800 | 0.882 | 0.897 | 0.590 | 0.923 | 0.961 |
|  | Zn/(Ga + Zn) | 0.882 | 0.800 | 0.733 | 0.385 | 0.923 | 0.961 |
| State of semiconductor | XRD | Amorphous | Amorphous | Amorphous | Amorphous | Amorphous | Amorphous |
| Members used in transistor | Substrate | Glass | Glass | Glass | Glass | Glass | Silicon |
|  | Gate insulating film | SiN$x$ | SiN$x$ | SiN$x$ | SiN$x$ | SiN$x$ | $SiO_2$ thermally oxidized film |
|  | Passivation layer | $SiO_2$ | $SiO_2$ | $SiO_2$ | $SiO_2$ | $SiO_2$ | $SiO_2$ |
| Heat treatment |  | Under $N_2$ 150° C. 2 Hr | Under $N_2$ 150° C. 2 Hr | Under $N_2$ 150° C. 2 Hr | Under $N_2$ 150° C. 2 Hr | Under $N_2$ 150° C. 2 Hr | Under $N_2$ 150° C. 2 Hr |
| Transistor properties | Mobility ($cm^2$/Vs) | 11 | 17 | 25 | 6 | 15 | 17 |
|  | On-off ratio | $10^{10}$ | $10^8$ | $10^8$ | $10^8$ | $10^9$ | $10^{10}$ |
|  | Off current (pA) | 0.05 | 0.5 | 1 | 0.05 | 0.5 | 0.05 |
|  | Gate leakage current (pA) | 0.05 | 0.3 | 0.5 | 0.05 | 0.3 | 0.05 |
|  | S value (V/dec) | 0.15 | 0.29 | 0.45 | 0.55 | 0.15 | 0.2 |
|  | Vth (V) | 0.6 | 0.4 | 0.2 | 3.5 | 0.5 | 0.2 |
|  | Hysteresis | Slight | Slight | Slight | Slight | Slight | Slight |
|  | Vth variation in the air (V) | <±0.2 | <±0.2 | <±0.2 | <±0.2 | <±0.2 | <±0.2 |
| Stress test | Threshold voltage shift Δ Vth (V) | 0.5 | 0.5 | 1.2 | 0.2 | 0.6 | 0.6 |

TABLE 3

|  |  | Comparative Examples |  |  |  |  |  |
|---|---|---|---|---|---|---|---|
|  |  | 1 | 2 | 3 | 4 | 5 | 6 |
| Method and conditions for forming semiconductor layer | Sputtering method | RF | RF | RF | RF | RF | RF |
|  | Total pressure (Pa) | 0.2 | 0.2 | 0.2 | 0.2 | 0.2 | 0.2 |
|  | Atmospheric gas | Ar: 99.5% $O_2$: 0.5% | Ar: 99.5% $O_2$: 0.5% | Ar: 99.5% $O_2$: 0.5% | Ar: 99.5% $O_2$: 0.5% | Ar: 99.5% $O_2$: 0.5% | Ar: 99.5% $O_2$: 0.5% |

TABLE 3-continued

| | | Comparative Examples | | | | | |
|---|---|---|---|---|---|---|---|
| | | 1 | 2 | 3 | 4 | 5 | 6 |
| Composition (atomic ratio) of target and semiconductor | In/(In + Zn + Ga) | 0.5 | 0.02 | 0.49 | 0.32 | 0.32 | 0.32 |
| | Zn/(In + Zn + Ga) | 0.5 | 0.49 | 0.02 | 0.32 | 0.32 | 0.32 |
| | Ga/(In + Zn + Ga) | | 0.49 | 0.49 | 0.36 | 0.36 | 0.36 |
| | In/(In + Zn) | 0.500 | 0.039 | 0.961 | 0.500 | 0.500 | 0.500 |
| | In/(In + Ga) | 1.000 | 0.039 | 0.500 | 0.471 | 0.471 | 0.471 |
| | Zn/(Ga + Zn) | 1.000 | 0.500 | 0.039 | 0.471 | 0.471 | 0.471 |
| State of semiconductor | XRD | Amorphous | Amorphous | Amorphous | Amorphous | Amorphous | Amorphous |
| Members used in transistor | Substrate | Glass | Glass | Glass | Glass | Glass | Glass |
| | Gate insulating film | SiNx | SiNx | SiNx | SiNx | SiNx | SiNx |
| | Passivation layer | $SiO_2$ | None | None | $SiO_2$ | None | None |
| Heat treatment | | Under $N_2$ 150° C. 2 Hr | Under $N_2$ 150° C. 2 Hr | Under $N_2$ 150° C. 2 Hr | Under $N_2$ 150° C. 2 Hr | Under $N_2$ 150° C. 2 Hr | Under $N_2$ 350° C. 2 Hr |
| Transistor properties | Mobility ($cm^2$/Vs) | 21 | — | 0.4 | 2 | 1 | 4 |
| | On-off ratio | $10^7$ | — | $10^3$ | $10^7$ | $10^3$ | $10^4$ |
| | Off current (pA) | 5 | — | 10 | 0.05 | 1000 | 100 |
| | Gate leakage current (pA) | 2 | — | 2 | 0.05 | 10 | 8 |
| | S value (V/dec) | 0.85 | — | 2 | 2 | 4 | 3 |
| | Vth (V) | 0.3 | — | 6 | 1.5 | −35 | −40 |
| | Hysteresis | Substantial | — | Slight | Slight | Slight | Slight |
| | Vth variation in the air (V) | <±0.2 | ±2 | ±2 | <±0.2 | ±2 | ±2 |
| Stress test | Threshold voltage shift Δ Vth (V) | 1.5 | — | 2 | 0.4 | 2 | 1 |

TABLE 4

| | | Comparative Examples | | | | |
|---|---|---|---|---|---|---|
| | | 7 | 8 | 9 | 10 | 11 |
| Methods and conditions for forming semiconductor layer | Sputtering method | RF | RF | RF | RF | RF |
| | Total pressure (Pa) | 0.2 | 0.2 | 0.2 | 0.2 | 0.2 |
| | Atmospheric gas | Ar: 99.5% $O_2$: 0.5% | Ar: 99.5% $O_2$: 0.5% | Ar: 99.5% $O_2$: 0.5% | Ar: 99.5% $O_2$: 0.5% | Ar: 99.5% $O_2$: 0.5% |
| Composition (atomic ratio) of target and semiconductor | In/(In + Zn + Ga) | 0.32 | 0.1 | 1 | | |
| | Zn/(In + Zn + Ga) | 0.32 | 0.1 | | 1 | |
| | Ga/(In + Zn + Ga) | 0.36 | 0.8 | | | 1 |
| | In/(In + Zn) | 0.500 | 0.500 | 1.000 | — | — |
| | In/(In + Ga) | 0.471 | 0.111 | 1.000 | — | — |
| | Zn/(Ga + Zn) | 0.471 | 0.111 | — | 1.000 | — |
| State of semiconductor | XRD | Amorphous | Polycrystalline | Polycrystalline | Polycrystalline | Polycrystalline |
| Members used in transistor | Substrate | Glass | Glass | Glass | Glass | Glass |
| | Gate insulating film | SiNx | SiNx | SiNx | SiNx | SiNx |
| | Passivation layer | $SiO_2$ | None | None | None | None |
| Heat treatment | | None | Under $N_2$ 150° C. 2 Hr | Under $N_2$ 150° C. 2 Hr | Under $N_2$ 150° C. 2 Hr | Under $N_2$ 150° C. 2 Hr |
| Transistor properties | Mobility ($cm^2$/Vs) | 0.1 | — | — | 0.01 | — |
| | On-off ratio | $10^2$ | — | — | $10^3$ | — |
| | Off current (pA) | 1000 | — | 1000000 | 1 | — |
| | Gate leakage current (pA) | 10 | — | 1000000 | 1 | — |
| | S value (V/dec) | 6 | — | — | 1 | — |
| | Vth (V) | −45 | — | Normally on | −1 | — |
| | Hysteresis | Substantial | — | — | Significant | — |
| | Vth variation in the air (V) | ±5 | ±2 | ±2 | ±2 | ±2 |
| Stress test | Threshold voltage shift Δ Vth (V) | 5 | — | — | 5 | — |

The thin film of Comparative Example 4 had an In—In average bonding distance obtained by the X-ray absorption spectrometry of 0.321 nm. Further, from the relationship between the carrier concentration and the activation energy measured by using the hall effect, the energy width ($E_0$) on the non-localized level was found to be 20 meV.

The field effect transistors in Comparative Examples 2, 8, 9 and 11 did not function as field effect transistors.

Example 14

Preparation of Target II

As the raw material, indium oxide collected from an used ITO target, 5N zinc oxide (ZNO04PB, manufactured by Kojundo Chemical Laboratory Co., Ltd.) and 5N gallium oxide (GAO03PB, manufactured by Kojundo Chemical Laboratory Co., Ltd.) were mixed such that the atomic ratio [In/(In +Zn+Ga)] became 0.42, the atomic ratio [Zn/(In +Zn+Ga)] became 0.42 and the atomic ratio [Ga/(In +Zn+Ga)] became 0.16. The mixture was supplied to a wet type ball mill and pulverized and mixed for 72 hours to obtain raw material fine powder.

The resulting raw material fine powder was pulverized, and press-molded into a size of 10 cm in diameter and 5 mm in thickness. The molded product was put in a firing furnace, and fired at 1500° C. for 12 hours, whereby a sintered body (target) was obtained.

The target was pulverized and analyzed by ICP, and it was found that Sn (tin) was contained in an amount of 500 ppm as impurities. The bulk resistance of the target was 3 mΩ and the theoretical relative density was 0.99. The target had an appearance improved in uniformity suffering from no unevenness in color.

Examples 15 to 19

Targets III to VII

Targets were prepared in the same manner as in the preparation of Target II, except that Ge, Si, Ti, Zr or Hf was added in the form of an oxide such that the amount thereof became 500 atomic ppm relative to the total metal elements in the raw material. The quality of the resulting target was almost equivalent to that of Target II, but the appearance thereof was more uniform and excellent as compared with Target II.

A thin film was formed in the same manner as in B(1) of Example 1, except that Targets II to VII were used. Almost same results as those in Example 1 were obtained when Targets II to VII were used. Further, when continuously discharged for a long period of time, frequency of occurrence of abnormal discharge or the amount of yellow flakes were decreased as compared with the case where Target I was used.

Example 20

A sputtering target was prepared in the same manner as in Example 1, except that the mixing ratio of indium oxide, zinc oxide and gallium oxide was changed to that shown in Table 5.

Using the above-obtained target, evaluation of the semiconductor layer and preparation and evaluation of a field effect transistor were conducted in the same manner as in Example 1, except that the film forming conditions were changed to those shown in Table 5.

Examples 21 and 22

Sputtering targets were prepared in the same manner as in Example 1, except that the mixing ratio of indium oxide, zinc oxide and gallium oxide was changed to that shown in Table 5.

Using the above-obtained targets, evaluation of the semiconductor layer and preparation and evaluation of a field effect transistor were conducted in the same manner as in Example 1, except that the film forming conditions were changed to those shown in Table 5.

Figure 10:
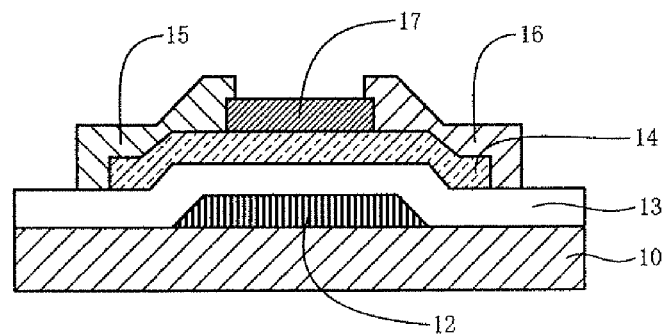
FIG. 10 is a schematic cross-sectional view of a semi-field effect transistor prepared in Example 21 and Example 22.

In Example 21 and Example 22, a semi-field effect transistor having a configuration shown in FIG. 10 was prepared.

Example 23

A sputtering target was prepared in the same manner as in Example 1, except that the mixing ratio of indium oxide, zinc oxide and gallium oxide was changed to that shown in Table 5.

Using the above-obtained target, a semiconductor layer was formed under the conditions shown in FIG. 5, and evaluated. Further, a semi-field effect transistor shown in FIG. 11 was prepared in the following steps and evaluated in the same manner as in Example 1.

On a glass substrate, metal molybdenum was formed in a thickness of 200 nm by RF sputtering at room temperature, followed by patterning by wet etching to prepare a gate electrode.

Subsequently, on the substrate on which the gate electrode was prepared, SiOx was formed into a film (thickness: 200 nm) at 300° C. by a plasma-enhanced chemical vapor deposition (PECVD) apparatus to form a gate insulating film.

Then, a thin film was formed by using the resulting target, followed by patterning to form a semiconductor layer.

Subsequently, SiOx was formed into a film (thickness: 200 nm) at 300° C. by a plasma-enhanced chemical vapor deposition (PECVD) apparatus. A positive resist was applied, and the resist was patterned by back irradiation using the gate electrode as a mask.

Figure 11:
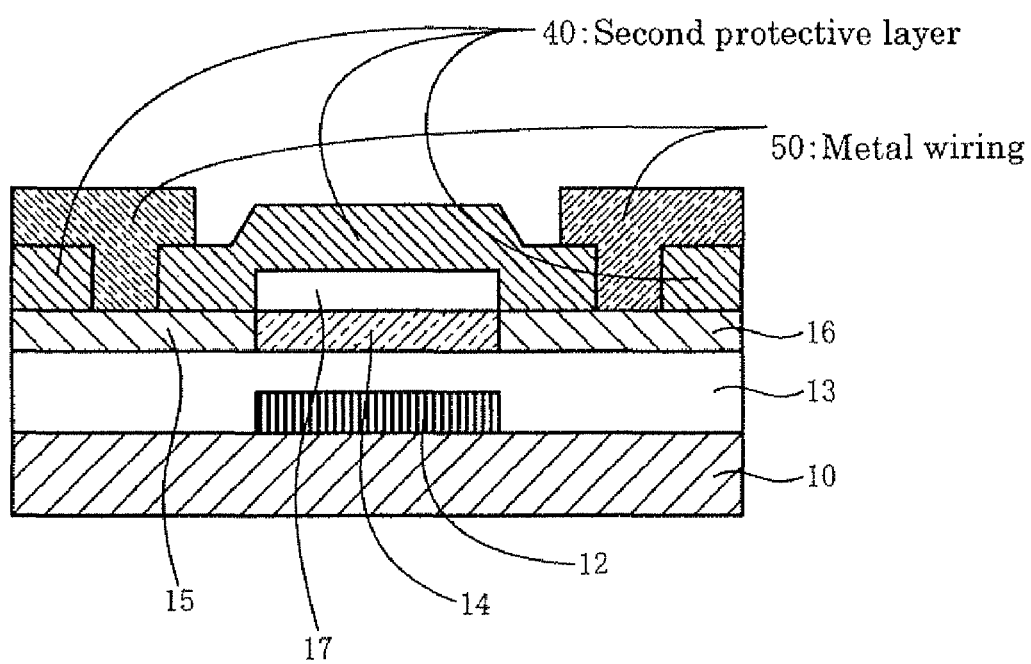
FIG. 11 is a schematic cross-sectional view of a semi-field effect transistor prepared in Example 23 and Example 24.

Then, an SiNx:H film was formed as the second protective film by a plasma-enhanced chemical vapor deposition (PECVD) apparatus. At this time, the semiconductor layer was reduced by hydrogen plasma, and the resistance was decreased to form source/drain electrodes. A contact hole was formed to attain contact with metal wirings. As a result, a coplanar type field effect transistor having a channel width W of 20 μm and a channel length L of 10 μm in which the source/drain electrodes and the semiconductor layer were homogenized and the gate electrode was self-aligned with the semiconductor layer was obtained (FIG. 11).

The resulting transistor had improved moisture proof since it had the SiNx:H film as the second protective film.

Example 24

A coplanar type field effect transistor having a channel width W of 20 μm and a channel length L of 10 μm in which the gate electrode was self-aligned with the semiconductor layer was obtained in the same manner as in Example 23, except that the semiconductor layer was reduced by using an Ar plasma instead of a hydrogen plasma, and an SiOx film was formed as the second protective film by TEOS-CVO.

The reason that the transistor thus produced was improved in off current or S value as compared with the transistor of Example 23 is assumed that hydrogen was not diffused in the semiconductor film.

TABLE 5

|  |  | Examples | | | | |
| --- | --- | --- | --- | --- | --- | --- |
|  |  | 20 | 21 | 22 | 23 | 24 |
| Method and conditions for forming semiconductor layer | Sputtering method | DC | DC | DC | DC | DC |
|  | Total pressure (Pa) | 0.2 | 0.2 | 0.2 | 0.2 | 0.2 |
|  | Atmospheric gas | Ar: 99% $O_2$: 1% | Ar: 99% $O_2$: 1% | Ar: 99% $O_2$: 1% | Ar: 99% $O_2$: 1% | Ar: 99% $O_2$: 1% |
| Composition (atomic ratio) of target and semiconductor | In/(In + Zn + Ga) | 0.35 | 0.35 | 0.43 | 0.35 | 0.35 |
|  | Zn/(In + Zn + Ga) | 0.5 | 0.5 | 0.42 | 0.5 | 0.5 |
|  | Ga/(In + Zn + Ga) | 0.15 | 0.15 | 0.15 | 0.15 | 0.15 |
|  | In/(In + Zn) | 0.412 | 0.412 | 0.506 | 0.412 | 0.412 |
|  | In/(In + Ga) | 0.700 | 0.700 | 0.741 | 0.700 | 0.700 |
|  | Zn/(Ga + Zn) | 0.769 | 0.769 | 0.737 | 0.769 | 0.769 |

TABLE 5-continued

| | | Examples | | | | |
|---|---|---|---|---|---|---|
| | | 20 | 21 | 22 | 23 | 24 |
| State of semiconductor | XRD | Amorphous | Amorphous | Amorphous | Amorphous | Amorphous |
| Members used in transistor | Substrate | Glass | Glass | Glass | Glass | Glass |
| | Gate insulating film | $SiO_2$ | $SiO_2$ | $SiO_2$ | $SiO_2$ | $SiO_2$ |
| | Passivation layer | $SiO_2$ | $SiO_2$ | $SiO_2$ | $SiO_2$ | $SiO_2$ |
| Heat treatment | | Under $N_2$ 300° C. 2 Hr | Under $N_2$ 300° C. 2 Hr | Under $N_2$ 300° C. 2 Hr | Under $N_2$ 300° C. 2 Hr | Under $N_2$ 300° C. 2 Hr |
| Transistor properties | Mobility ($cm^2$/Vs) | 18 | 20 | 21 | 18 | 20 |
| | On-off ratio | $10^{10}$ | $10^{10}$ | $10^{10}$ | $10^9$ | $10^{10}$ |
| | Off current (pA) | 0.05 | 0.05 | 0.1 | 0.5 | 0.05 |
| | Gate leakage current (pA) | 0.05 | 0.05 | 0.05 | 0.5 | 0.05 |
| | S value (V/dec) | 0.1 | 0.1 | 0.1 | 0.3 | 0.1 |
| | Vth (V) | 0.5 | 0.5 | 0.5 | 0.5 | 0.5 |
| | Hysteresis | Slight | Slight | Slight | Slight | Slight |
| | Vth variation in the air (V) | <±0.2 | <±0.2 | <±0.2 | <±0.2 | <±0.2 |
| Stress test | Threshold shift Δ Vth (V) | 0.1 | 0.1 | 0.1 | 0.6 | 0.1 |

INDUSTRIAL APPLICABILITY

The field effect transistor of the invention can be applied to an integrated circuit such as a logical circuit, a memory circuit, and a differential amplification circuit. In particular, the field effect transistor of the invention can be preferably used as a switching element for driving a liquid crystal display or an organic EL display.

The invention claimed is:

1. A field effect transistor which comprises, on a substrate, at least a semiconductor layer, a passivation layer, a source electrode, a drain electrode, a gate insulating film and a gate electrode,
the source electrode and the drain electrode being connected to each other through the semiconductor layer,
the gate insulating film being present between the gate electrode and the semiconductor layer,
the passivation layer being at least on one surface side of the semiconductor layer, and
the semiconductor layer comprising a composite oxide which comprises In (indium), Zn (zinc) and Ga (gallium) in the following atomic ratios (1) to (3):

$$In/(In+Zn)=0.2 \text{ to } 0.8 \quad (1)$$

$$In/(In+Ga)=0.59 \text{ to } 0.99 \quad (2)$$

$$Zn/(Ga+Zn)=0.29 \text{ to } 0.99 \quad (3),$$

wherein the semiconductor layer is an amorphous film which has an energy width ($E_0$) on the non-localized level of 14 meV or less.

2. The field effect transistor according to claim 1, wherein the composite oxide further satisfies the following atomic ratio (4):

$$Ga/(In+Zn+Ga)=0.01 \text{ to } 0.2 \quad (4).$$

3. The field effect transistor according to claim 1, wherein the semiconductor layer is an amorphous film which keeps at least part of the edge-sharing structure of a bixbyite structure of indium oxide.

4. The field effect transistor according to claim 1, which has a field effect mobility of 1 $cm^2$/Vs or more, an on off ratio of $10^6$ or more, an off current of 1 pA or less, an S value of 0.8 V/dec or less, a threshold voltage of 0 V or more and 10 V or less, and an amount of shift in threshold voltage before and after application of a 10 μA-direct voltage at 50° C. for 100 hours of 1.5 V or less.

5. The field effect transistor according to claim 1, which has a structure for shielding the semiconductor layer from light.

6. The field effect transistor according to claim 1, wherein the passivation layer for the semiconductor layer comprises an amorphous oxide or an amorphous nitride.

7. The field effect transistor according to claim 1, wherein at least one of the source electrode, the drain electrode and the gate electrode comprises an alloy containing copper.

8. The field effect transistor according to claim 1, which further comprises a contact layer between the semiconductor layer and at least one of the source electrode, the drain electrode and the gate electrode.

9. The field effect transistor according to claim 1, which further comprises an oxide resistant layer having a resistance higher than that of the semiconductor layer between the semiconductor layer and the gate insulating film and/or between the semiconductor layer and the passivation layer.

10. The field effect transistor according to claim 1, wherein the semiconductor layer further comprises one or more elements selected from the group consisting of Sn (tin), Ge (germanium), Si (silicon), Ti (titanium), Zr (zirconium) and Hf (hafnium) in an amount of 100 to 10000 atomic ppm.

11. A method for producing the field effect transistor according to claim 1, comprising the steps of forming a semiconductor layer by DC or AC sputtering by using a sintered target of a composite oxide and conducting a heat treatment at 70 to 350° C. after the formation of the semiconductor layer and a passivation layer for the semiconductor layer.

12. A liquid crystal display or an organic electroluminescence display using the field effect transistor according to claim 1.

* * * * *